United States Patent
Kotani et al.

(10) Patent No.: US 8,582,406 B2
(45) Date of Patent: Nov. 12, 2013

(54) INFORMATION RECORDING DEVICE DETECTING ISSUES IN A LASER INCLUDED THEREIN AND A METHOD OF CONTROLLING THE SAME

(71) Applicant: Sharp Kabushiki Kaisha, Osaka (JP)

(72) Inventors: Teruhisa Kotani, Osaka (JP); Takanobu Sato, Osaka (JP); Noboru Iwata, Osaka (JP); Tazuko Kitazawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/628,960

(22) Filed: Sep. 27, 2012

(65) Prior Publication Data

US 2013/0083636 A1      Apr. 4, 2013

(30) Foreign Application Priority Data

Sep. 30, 2011   (JP) .................................. 2011-218369

(51) Int. Cl.
   *G11B 11/00*      (2006.01)
(52) U.S. Cl.
   USPC ..................................... 369/53.12; 369/53.26
(58) Field of Classification Search
   None
   See application file for complete search history.

(56) References Cited

U.S. PATENT DOCUMENTS

| 5,625,616 A * | 4/1997 | Koike et al. ................ 369/53.26 |
| 2001/0038587 A1* | 11/2001 | Shumura et al. ........... 369/53.18 |
| 2005/0213436 A1* | 9/2005 | Ono et al. ................... 369/13.02 |
| 2009/0296257 A1* | 12/2009 | Nakano et al. .................. 360/71 |
| 2011/0038235 A1* | 2/2011 | Matsumoto et al. ....... 369/13.17 |
| 2011/0058273 A1 | 3/2011 | Sasaki et al. |

FOREIGN PATENT DOCUMENTS

| JP | 8-279642 A | 10/1996 |
| JP | 2004-335030 A | 11/2004 |
| JP | 2011014214 A | 1/2011 |
| JP | 2011060408 A | 3/2011 |

\* cited by examiner

*Primary Examiner* — Paul Huber
(74) *Attorney, Agent, or Firm* — Edwards Wildman Palmer LLP; David G. Conlin; Stephen D. LeBarron

(57) ABSTRACT

An information recording device in accordance with the present invention obtains drive information of a semiconductor laser which is included in a magnetic head by means of a drive information obtaining section and successively records the information in a drive information storing section. A magnetic head control section controls the magnetic head in accordance with a condition of the semiconductor laser on the basis of the drive information thus obtained by the drive information obtaining section.

22 Claims, 13 Drawing Sheets

INFORMATION RECORDING DEVICE DETECTING ISSUES IN A LASER INCLUDED THEREIN AND A METHOD OF CONTROLLING THE SAME

This Nonprovisional application claims priority under 35 U.S.C. §119 on Patent Application No. 2011-218369 filed in Japan on Sep. 30, 2011, the entire contents of which are hereby incorporated by reference.

TECHNICAL FIELD

The present invention relates to an information recording device that records information in a magnetic recording medium such as a hard disk. More specifically, the present invention relates to an information recording device which includes a semiconductor laser, the information recording device capable of estimating a life of the semiconductor laser, a degree of deterioration in the semiconductor laser, and the like, or detecting an abnormality occurred in the semiconductor laser.

BACKGROUND ART

In recent years, not only information apparatus but also various apparatus (e.g., household electrical appliances such as a television and image recording device, and sound reproduction devices) have a built-in magnetic recording device. Accordingly, there are growing demands for magnetic recording devices.

In addition, the volume of information to be stored is also increasing year by year, which has fueled efforts to develop technologies for improving storage density of magnetic recording devices. Especially, in recent years, as storage density of magnetic recording devices increases, there is a need for improvement in performance of a magnetic head and a recording medium (hard disk etc.).

In order to increase storage density in a magnetic recording device, it is effective to configure a recording medium with smaller grains. However, magnetization of smaller grains is poor in heat stability. This may cause recording bit inversion even due to heat energy at room temperature.

In order to solve this problem, it is effective to increase anisotropy energy of the grains. However, high anisotropy energy of the grain increases a coercive force of a recording medium, so that it becomes impossible for an existing magnetic head to invert magnetization of the grain. This causes a problem that it is difficult to record information.

Solutions to these problems are disclosed in, for example, Patent Literatures 1 and 2. Patent Literatures 1 and 2 disclose a method called "optical assist magnetic recording". In this method, a recording medium with high coercive force is used. In order to record information, an information recording region of the recording medium is irradiated with light so that a temperature of the light-irradiated region rises. This lowers the coercive force temporarily so that information is recorded. The recording medium which has recorded information is then cooled down so as to increase coercive force and thus increase heat stability.

In such optical assist magnetic recording, storage density of a recording medium depends on a size of the light-irradiated region. Therefore, near-field light is commonly used to increase the storage density. For example, a piece of metal including a near-field light emitting section is irradiated with laser light so as to excite a surface plasmon. This enables to emit near-field light in a region smaller than a diffraction limit of light, the region in the near-field light emitting section. Irradiating a recording medium with this near-field light enables to heat only a minute region of the recording medium.

In an optical assist magnetic recording device, a semiconductor laser is commonly used as a small device which can be manufactured at low cost. The semiconductor laser is one of the fundamental components of the optical assist magnetic recording device, and a characteristic of the semiconductor laser has significant influence on a characteristic of the optical assist magnetic recording device.

In general, a characteristic of the semiconductor laser is easily affected by a usage environment. For example, an increase in a drive temperature (ambient temperature) causes a higher oscillation threshold, lower optical output under a certain electric current, lower efficiency in light emitting, and other such problems. Also, even under an identical usage environment, a higher oscillation threshold and lower optical output are observed due to deterioration over time. Furthermore, the semiconductor laser is vulnerable to noise of a power supply, and input of an electric current, as noise, which is greater than a rated current may cause an irreversible deterioration.

FIG. 13 is a graph showing a relationship between drive time and drive current of a common semiconductor laser. FIG. 13 illustrates the relationship between drive time and drive current (electric current) in a case where the semiconductor laser is continuously used with a constant optical output of the semiconductor laser under constant ambient temperature.

As shown in FIG. 13, even under such a condition in which there is no power supply noise and no fluctuation of ambient temperature, drive current of a semiconductor laser tend to increase with drive time due to spread of a defect inside the semiconductor or the like. In addition, although the drive current increases linearly along with time before the drive time reaches a given drive time tz, the drive current tend to increase rapidly once the drive time exceeds the given drive time tz.

Therefore, a stable usage of a semiconductor laser is possible until the drive time tz. A life (durable period) of a semiconductor laser is generally set to be shorter than the drive period tz or a drive period tz estimated by a manufacturer. The life of a semiconductor serves as an indication for an end of usage of a semiconductor laser or a time to change elements.

Although a life of a semiconductor laser is commonly approximately 7,000 to 50,000 hours, the life of a semiconductor laser varies depending on an operating condition (especially, ambient temperature, a condition of a power supply, or the like). The life of a semiconductor laser tends to be shorter in a severer condition (e.g., higher ambient temperature, more power supply noise, or the like).

Assuming that a magnetic recording device is a built-in hard disk included in a computer of a PC or the like, an operating condition of magnetic recording devices varies with individual device. For example, a drive temperature of a semiconductor laser varies in accordance with a temperature of an environment where the computer has been installed, a cooling effect inside the computer, or other such conditions. Therefore, the life of a semiconductor laser is more likely to vary with individual semiconductor laser.

A malfunction of a semiconductor laser causes an optical assist magnetic recording device to record insufficiently. Furthermore, in a case where the above life of the semiconductor laser is shorter than a life of other machine parts included in the magnetic recording device, the life of the semiconductor laser can be a life of the optical assist magnetic recording device.

Accordingly, it is important to estimate a life of a semiconductor laser and to perform stable drive from the viewpoint of stabilization of recording properties of an optical assist magnetic recording device and data protection.

Conventionally, SMART (Self-Monitoring, Analysis and Reporting Technology) has been used for estimating a life (malfunction) of a hard disk. The SMART, for example, stores drive records of a hard disk under dozens of categories (e.g., the number of seeking and the number of reading errors). The SMART then performs a self-analysis of a characteristic of the hard disk based on the drive record. The SMART enables estimation of a life affected by deterioration over time under a stable usage environment. However, no category regarding a life of a semiconductor laser is provided to the SMART.

On the other hand, Patent Literature 2 discloses an arrangement for detecting a drive temperature of a laser element as a means of stabilizing light intensity of the laser element in an optical assist magnetic recording device. In the optical assist magnetic recording device disclosed in Patent Literature 2, optical output of the laser element is stabilized by feeding back the detected drive temperature of a laser element and optical output.

Moreover, Patent Literatures 3 and 4 disclose arrangements for estimating a life of a laser element from a value obtained by measuring a drive current and a drive temperature. Patent Literatures 3 and 4 also disclose devices which include the arrangements.

Specifically, a light-emission driving device disclosed in Patent Literature 3 calculates out, on the bases of a drive temperature obtained when a laser element is driven, deterioration threshold current corresponding to the drive temperature by using a temperature correction factor. If a drive current of a laser light exceeds the deterioration threshold current thus calculated out, injection of current is suspended so as to stabilize the light-emission driving device.

Furthermore, an optical disk device disclosed in Patent Literature 4 stores a temperature correction factor and a drive temperature, and calculates out accumulated time from a drive temperature of a laser element. If accumulated time of the laser element exceeds a threshold, the optical disk device bans high output drive (recording) of the laser element and permits only low output drive (reproduction). This enables the stabilization of the optical disk device.

CITATION LIST

Patent Literatures

Patent Literature 1
Japanese Patent Application Publication, Tokukai, No. 2011-060408 (Publication Date: Mar. 24, 2011)
Patent Literature 2
Japanese Patent Application Publication, Tokukai, No. 2011-014214 (Publication Date: Jan. 20, 2011)
Patent Literature 3
Japanese Patent Application Publication, Tokukaihei, No. 8-279642 (Publication Date: Oct. 22, 1996)
Patent Literature 4
Japanese Patent Application Publication, Tokukai, No. 2004-335030 (Publication Date: Nov. 25, 2004)

SUMMARY OF INVENTION

Technical Problem

However, in the arrangement disclosed in Patent Literature 2, adjustment of optical output of a laser element is carried out real-time while detecting a drive temperature of the laser element. Therefore, although the arrangement is effective for stable drive of the laser element, it is impossible to estimate a future remaining life of the laser element.

In addition, the arrangements disclosed in Patent Literatures 3 and 4 cannot estimate a remaining life of a laser element at a given point of time. Therefore, it is impossible to take an advance measure against a malfunction of a device, the malfunction which may occur in the future accompanying a malfunction of a laser element.

Furthermore, in the optical disk disclosed in Patent Literature 4, since a temperature correction factor is fixed in advance by a manufacturer, variation among each laser element cannot be compensated for.

The present invention has been made in view of the problems, and the first object of the present invention is to provide an information recording device that can (i) estimate, on the bases of a record of drive condition of a laser element and the like, a remaining life of the laser element and a degree of deterioration at a given point of time and provide a user with the estimation or (ii) carry out an operation for avoiding an elimination of recorded information, based on the estimation.

In addition, the second object of the present invention is to provide an information recording device that can protect information recorded in a recording medium, in a case where it is perceived that a life of a laser element is coming to an end, laser element has already reached its life span, or an unexpected abnormality has occurred in a laser element.

Accordingly, the present invention provides a user with an information recording device with high recording reliability.

Solution to Problem

In order to attain the objects, an information recording device in accordance with the present invention includes: a head section that includes a light emitting element for heating a magnetic recording medium capable of recording information, and a magnetic field generating element for recording information in the magnetic recording medium; a drive information obtaining section for obtaining, as a drive information of the light emitting element, a drive condition in which the light emitting element is operating; a drive information storing section that is capable of storing therein the drive information thus obtained by the drive information obtaining section; and a head control section that controls an operation of the head section.

According to the above arrangement, the information recording device in accordance with the present invention includes the drive information storing section that can store drive information (e.g., a drive temperature, a drive current, optical output, the number of seeking, and the number of reading errors), the drive information having been obtained by the drive information obtaining section.

Therefore, according to the above arrangement, it is possible to refer to past drive information of a light emitting element. This makes it possible to add a new function to the information recording device by applying an application that uses (utilizes) the record of drive information.

For example, it is possible to estimate a degree of load having been generated in a light emitting element in the past in accordance with a record of drive information, the drive information having been stored in the drive information storing section. This makes it possible to accurately estimate a remaining life of the light emitting element, a current degree of deterioration in the light emitting element, and the like.

As described above, the arrangement makes it possible to grasp a state of a light emitting element by using drive information. Accordingly, the head control section controls the head section in accordance with the state of the light emitting element so as to prevent wrong information from being recorded.

Thus, according to the above arrangement, it is possible to realize an information recording device with high recording reliability.

In order to attain the above objects, an information recording device in accordance with the present invention includes: a head section that includes a light emitting element for heating a magnetic recording medium capable of recording information, and a magnetic field generating element for recording information in the magnetic recording medium; a drive information obtaining section for obtaining, as a drive information of the light emitting element, a drive condition in which the light emitting element is operating; an abnormality detecting section for detecting an abnormality by comparing (i) a value which is indicated in the drive information obtained by the drive information obtaining section with (ii) a reference value predetermined in advance; and a head control section that controls an operation of the head section in accordance with a detection result detected by the abnormality detecting section.

In the above arrangement, the head control section controls the head section in accordance with a detection result obtained by the abnormality detecting section. The abnormality detecting section detects an abnormality in the light emitting element by comparing a value indicated in the drive information having been obtained by the drive information obtaining section with a reference value set in advance.

Therefore, in a case in which an unexpected abnormality occurred in the light emitting element, the above arrangement allows the abnormality detecting section to detect the abnormality. This makes it possible, for example, to limit or suspend the operation of a head including the light emitting element in which the abnormality has been detected.

Thus, according to the above arrangement, it is possible to realize an information recording device with high recording reliability.

A method of controlling an information recording device in accordance with the present invention includes the steps of: (a) recording information in a magnetic recording medium by using a head section that includes a light emitting element for heating a magnetic recording medium capable of recording information, and a magnetic field generating element for recording information in the magnetic recording medium; (b) obtaining, as a drive information of the light emitting element, a drive condition in which the light emitting element is operating in the step (a); and (c) controlling the head section for controlling an operation of the head section in accordance with the drive information thus obtained in the step (b) or/and a record of the drive information, the record in which the drive information thus obtained in the step (b) has been stored.

The above arrangement includes the step of controlling the head for controlling an operation of the head section in accordance with drive information having been obtained in the step of obtaining drive information or/and a record of the drive information, the record in which the drive information obtained in the step of obtaining drive information has been stored.

Therefore, according to the above arrangement, it is possible to refer to past drive information of a light emitting element. This makes it possible to add a new function to the information recording device by applying an application which uses (utilizes) a record of drive information.

For example, it is possible to estimate a degree of load having been generated in a light emitting element in the past in accordance with a record of drive information, the drive information having been stored in the drive information storing section. This makes it possible to accurately estimate a remaining life of the light emitting element, a current degree of deterioration in the light emitting element, and the like.

As described above, the arrangement makes it possible to grasp a state of a light emitting element by using drive information. Accordingly, it is possible to control the head section in accordance with the state of the light emitting element so as to prevent wrong information from being recorded.

Thus, according to the above arrangement, it is possible to realize a method of controlling an information recording device with high recording reliability.

Advantageous Effects of Invention

As described above, in order to attain the above objects, an information recording device in accordance with the present invention includes: a head section that includes a light emitting element for heating a magnetic recording medium capable of recording information, and a magnetic field generating element for recording information in the magnetic recording medium; a drive information obtaining section for obtaining, as a drive information of the light emitting element, a drive condition in which the light emitting element is operating; a drive information storing section that is capable of storing therein the drive information thus obtained by the drive information obtaining section; and a head control section that controls an operation of the head section.

In addition, an information recording device in accordance with the present invention includes: a head section that includes a light emitting element for heating a magnetic recording medium capable of recording information, and a magnetic field generating element for recording information in the magnetic recording medium; a drive information obtaining section for obtaining, as a drive information of the light emitting element, a drive condition in which the light emitting element is operating; an abnormality detecting section for detecting an abnormality by comparing (i) a value which is indicated in the drive information obtained by the drive information obtaining section with (ii) a reference value predetermined in advance; and a head control section that controls an operation of the head section in accordance with a detection result detected by the abnormality detecting section.

A method of controlling an information recording device in accordance with the present invention includes the steps of: (a) recording information in a magnetic recording medium by using a head section that includes a light emitting element for heating a magnetic recording medium capable of recording information, and a magnetic field generating element for recording information in the magnetic recording medium; (b) obtaining, as a drive information of the light emitting element, a drive condition in which the light emitting element is operating in the step (a); and (c) controlling the head section for controlling an operation of the head section in accordance with the drive information thus obtained in the step (b) or/and a record of the drive information, the record in which the drive information thus obtained in the step (b) has been stored.

Therefore, the present invention yields an effect of providing an information recording device with high recording reliability and a method of controlling the information recording device with high recording reliability.

DESCRIPTION OF EMBODIMENTS

First Embodiment

The following description discusses the first embodiment of the information recording device in accordance with the present invention with reference to FIGS. 1 to 12.

<Arrangement of Information Recording Device 1>

Figure 1:
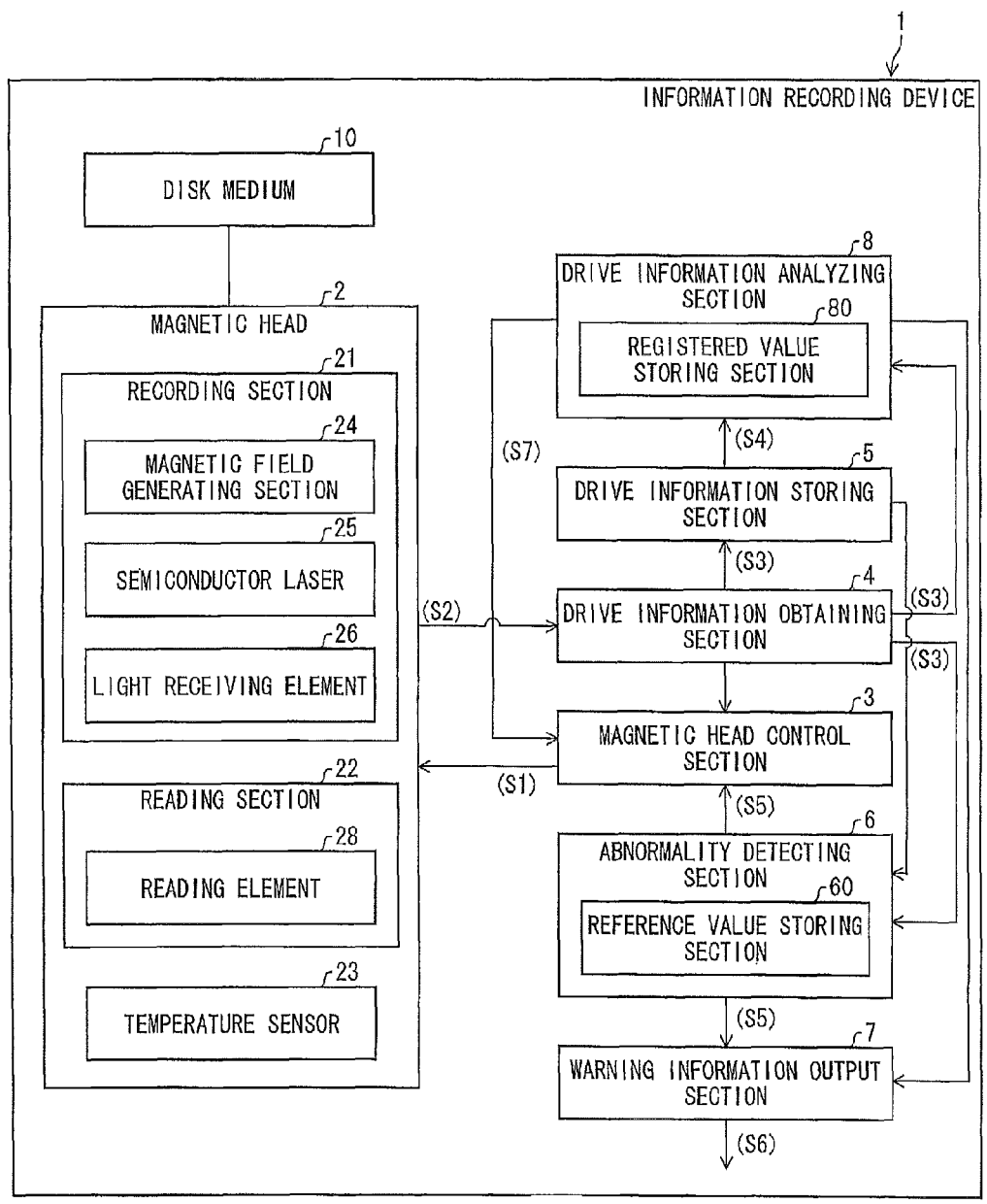
FIG. 1 is a block diagram showing an arrangement of relevant parts of an information recording device in accordance with the first embodiment.
Figure 2:
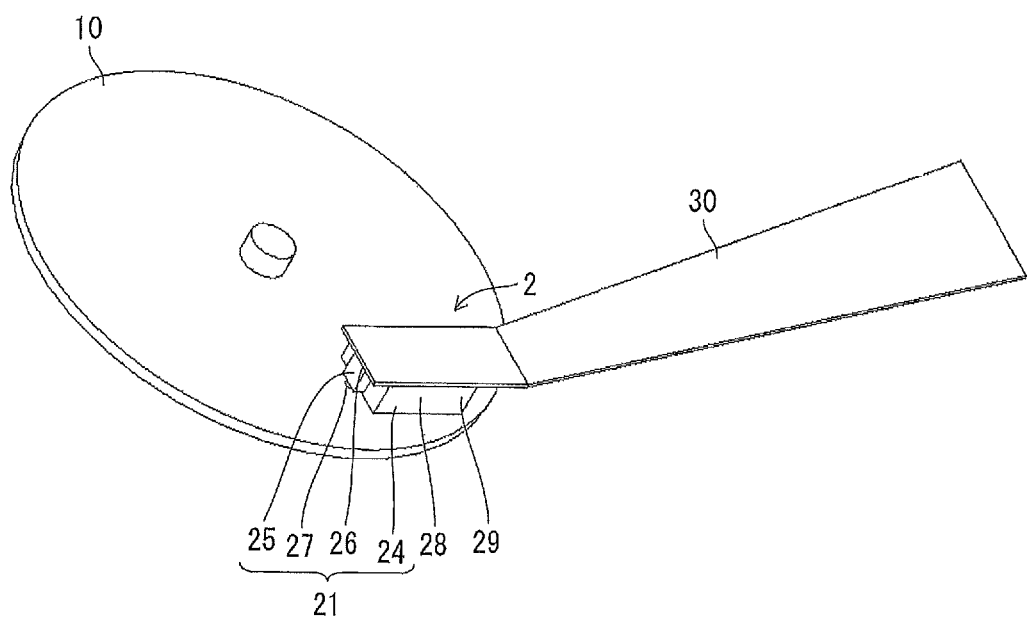
FIG. 2 is a perspective view showing an external configuration of the head shown in FIG. 1.

Firstly, the following description discusses the arrangement of an information recording device 1 in accordance with the present embodiment with reference to FIGS. 1 and 2. FIG. 1 is a block diagram showing an arrangement of relevant parts of the information recording device 1 in accordance with the present embodiment. FIG. 2 is a perspective view showing an external configuration of a magnetic head shown in FIG. 1.

The information recording device 1 includes a magnetic head (head section) 2, a magnetic head control section (head control section) 3, drive information obtaining section 4, a drive information storing section 5, an abnormality detecting section 6, a warning information output section 7, a drive information analyzing section 8, and a disk medium (magnetic recording medium) 10 (see FIG. 1).

(Magnetic Head 2)

The magnetic head 2 records and reads information for the disk medium 10. The magnetic head 2 includes a slider 29 to which a recording section 21, a reading section 22, and a temperature sensor 23 are provided.

The recording section 21 records information for the disk medium 10. The recording section 21 includes a magnetic field generating section (magnetic field generating element) 24, a semiconductor laser (light emitting element) 25, a light receiving element 26, and a near-field light emitting section 27. The recording section 21 scans the disk medium 10 for accessing data.

The magnetic field generating section 24 causes a generated magnetic field to change a direction of magnetization of the disk medium 10 so that information is recorded in the disk medium 10. Specifically, the magnetic field generating section 24 changes the direction of magnetization in an information recording region formed in the disk medium 10 so that a difference in the direction of magnetization is recorded as an information bit in the disk medium 10. For example, a coil is used for the magnetic field generating section 24.

The semiconductor laser 25 irradiates the near-field light emitting section 27 with light so that near-field light with a minute optical spot is generated in the near-field light emitting section 27. The near-field light having been generated in the near-field light emitting section 27 is emitted to the information recording region in the disk medium 10 so as to heat the information recording region. The heating increases a temperature in the information recording region, thereby lowering a coercive force therein. This enables the magnetic field generating section 24 to record information in the disk medium 10.

The light receiving element 26 detects optical output of the semiconductor laser 25. The light receiving element 26A is a photodiode or the like which is sensitive to a wavelength range of light being emitted from the semiconductor laser 25. The light receiving element 26 is provided in a vicinity of a surface of the semiconductor laser 25, the surface being opposite to another surface of the semiconductor laser 25 on which the near-field light emitting section 27 is provided. An electric current to be inputted to the semiconductor laser 25 is controlled by the magnetic head control section 3 (described below). Therefore, by feeding back, to the magnetic head control section 3, detection result of the optical output detection performed by the light receiving element 26, it is possible to control the semiconductor laser 25 so as to output substantially constant optical output for recording information.

The surface of the slider 29 which faces the disk medium 10 is an air bearing surface and has microscopic asperities formed thereon. When air generated by a rotation of the disk medium 10 flows into a gap between the air bearing surface and the disk medium 10, the microscopic asperities change atmospheric pressure, which causes lifting power in the slider 29.

On the other hand, the other surface of the slider 29, the surface opposite to the air bearing surface, is adhered to an end of a suspension 30. The suspension 30 which is made from stainless-steel sheet metal is used so as to press the slider 29 against a designated part of the disk medium 10. The slider 29 floats stably at a height where the pressure from the suspension 30 and the lifting power of the slider 29 are in balance. The asperities of the air bearing surface of the slider 29 are designed so that the height of stable floating is optimum.

The other end of the suspension 30 is connected to a magnetic head drive motor (not illustrated). The magnetic head drive motor is controlled by a control signal which is supplied from the magnetic head control section 3 so as to move the magnetic head 2 to a designated place.

The reading section 22 reads information recorded in the disk medium 10. The reading section 22 consists of a reading element 28 which is capable of reading (loading) information recorded in the disk medium 10. The reading element 28 is capable of detecting a difference in directions of magnetization of the disk medium 10. The reading element 28 is exemplified by a tunneling magneto-resistance element (TMR), a giant magneto-resistance element (GMR), or a current perpendicular-to-the-plane giant magneto-resistance (CPP-GMR) which are used in a common hard disk.

Note that the magnetic field generating section 24 and the reading element 28 are deposited on the air-bearing surface of the slider 29.

The temperature sensor 23 is a temperature detecting element that detects a drive temperature (ambient temperature) of the semiconductor leaser 25. The magnetic head 2 outputs, to the drive information obtaining section 4, a detecting signal S2 that includes a drive temperature detected by the temperature sensor 23.

(Magnetic Head Control Section 3)

The magnetic head control section 3 controls an operation of the magnetic head 2. The magnetic head control section 3 controls the operation of the magnetic head 2 in accordance with an external input signal or the like.

More specifically, the magnetic head control section 3 generates a magnetic head control signal S1 for driving the head drive motor and the semiconductor laser 25 etc. The magnetic head control section 3 then supplies, to the magnetic head 2, the magnetic head control signal S1 thus generated so as to control the operation of the magnetic head 2.

Further, when the magnetic head control section 3 receives, from the drive information obtaining section 4, detection result of the optical output detected by the receiving light receiving element 26, the magnetic head control section 3 controls an electric current which is to be supplied to the semiconductor 25 in accordance with the optical output so that the semiconductor laser 25 outputs a substantially constant optical output for recording information.

Note that the magnetic head control section 3 controls not only the operation of regular information recording/reading but also an operation of the magnetic head 2. The magnetic head control section 3 controls the operation of the magnetic head 2 in accordance with (i) an abnormality detecting signal S5 (described below) which is supplied from the abnormality detecting section 6 and (ii) an analyzing signal S7 (described below) which is supplied from the drive information analyzing section 8.

(Drive Information Obtaining Section 4)

The drive information obtaining section 4 obtains drive information from the detecting signal S2 supplied from the magnetic head 2. The drive information is various parameters that show a drive condition during operation of the semiconductor laser 25. Specifically, the drive information obtaining section 4 detects drive information such as a drive temperature of the semiconductor laser 25 detected by the temperature sensor 23, a drive current of the semiconductor laser 25, optical output of the semiconductor laser 25 detected by the light receiving element 26, the number of seeking and the number of reading errors in the operation of the semiconductor 25.

The drive information obtaining section 4 supplies the drive information thus obtained as a drive information signal S3 to the drive information storing section 5, the abnormality detecting section 6, and the drive information analyzing section 8. The drive information obtaining section 4 also supplies, to the magnetic head control section 3, a detection result of optical output of the semiconductor laser 25 which is detected by the light receiving element 26, and the like information.

(Drive Information Storing Section 5)

The drive information storing section 5 is a storing medium to which information can be written. The drive information storing section 5 successively records drive information of the semiconductor laser 25, the drive information being shown in a drive information signal S3 supplied from the drive information obtaining section 4. A record of drive information recorded in the drive information storing section 5 is read as a record information signal S4 by the abnormality detecting section 6 and the drive information analyzing section 8 in accordance with necessity.

(Abnormality Detecting Section 6)

The abnormality detecting section 6 consists of a program for estimating an abnormality in the information recording device 1 and a reference value storing section 60. The reference value storing section 60 stores (i) a reference value for judging whether or not a drive condition of the semiconductor laser 25 is abnormal and (ii) a designated threshold, the reference value and the designated threshold having been recorded in advance.

The abnormality detecting section 6 detects an abnormality in the semiconductor laser 25 by comparing, with the reference value stored in the reference value storing section 60, drive information indicated in the drive information signal S3 supplied from the drive information obtaining section 4. If an abnormality is detected in the semiconductor laser 25, the abnormality detecting section 6 generates an abnormality detecting signal S5 indicative that the abnormality is detected in the semiconductor laser 25. The abnormality detecting section 6 then supplies the abnormality detecting signal S5 to the magnetic head control section 3 and the warning information output section 7. This process in the abnormality detecting section 6 is described below in more detail.

(Warning Information Output Section 7)

The warning information output section 7 carries out a process for presenting (informing) warning information to a user in accordance with an abnormality detecting signal S5 having been supplied from the abnormality detecting section 6 and a control signal having been supplied from the drive information analyzing section 8. For example, when the warning information output section 7 receives an abnormality detecting signal S5 supplied from the abnormality detecting section 6, the warning information output section 7 generates a warning signal S6 for causing display section (not illustrated) or other such sections to display warning information. The warning information output section 7 then supplies the warning signal S6 to the display section or other such sections. This enables a user to know that an abnormality has occurred in the semiconductor 25.

(Drive Information Analyzing Section 8)

The drive information analyzing section 8 analyzes drive information so as to estimates a characteristic regarding functional impairment of the semiconductor laser 25. The drive information analyzing section 8 includes a program for estimating a remaining life of the semiconductor laser 25 and a registered value storing section 80. The registered value storing section 80 contains a value (described below) with which a remaining life of the semiconductor laser 25 is estimated and other such values, the values having been recorded in advance.

The drive information analyzing section 8, for example, reads and analyzes, in accordance with external demand, a record of drive information stored in the drive information storing section 5 so as to estimate a remaining life of the semiconductor laser 25. In addition, when a drive information signal S3 is supplied from the drive information obtaining section 4, the drive information analyzing section analyzes drive information indicated in the drive information signal S3 so as to estimate a remaining life of the semiconductor laser 25.

The drive information analyzing section 8 outputs, to the magnetic head control section 3, the result of the estimation of the remaining life of the semiconductor laser 25 as an analyzing signal S7.

Furthermore, when an estimated remaining life of the semiconductor laser 25 exceeds a threshold recorded in the registered value storing section 80, the drive information analyzing section 8 supplies, to the warning information output section 7, a control signal for informing a user that the estimated remaining life of the semiconductor laser 25 has exceeded the threshold. For example, suppose that a remaining life of 1,000 hours is registered in advance as a threshold in the registered value storing section 80. In this case, when the estimated remaining life of the semiconductor laser 25 goes under 1,000 hours, the drive information analyzing section 8 supplies, to the warning information output section 7, a control signal for informing the user that the remaining life of the semiconductor laser 25 has gone under 1,000 hours. This enables the user to know that the remaining life of the semiconductor laser 25 has gone under 1,000 hours. Note that a process in the drive information analyzing section 8 is described below in more detail.

<Process in Abnormality Detecting Section 6>

Next, the following description discusses in detail a process in the abnormality detecting section 6. In the present embodiment, the abnormality detecting section 6 included in the information recording device 1 detects an abnormality in a drive current of the semiconductor laser 25.

Figure 3:
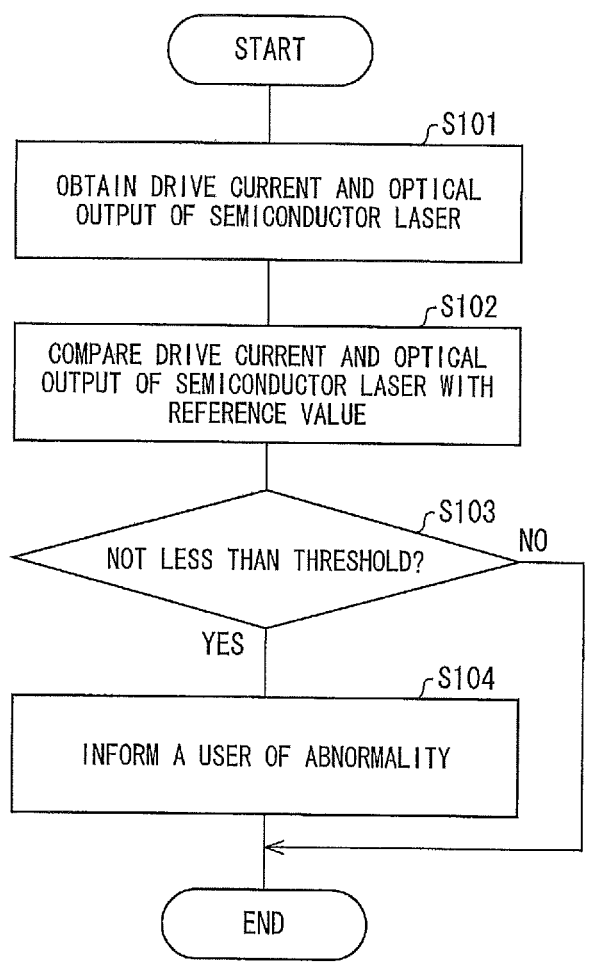
FIG. 3 is a flowchart showing how a process is carried out in the abnormality detecting section shown in FIG. 1.

FIG. 3 is a flowchart showing how the abnormality detecting section 6 operates. The abnormality detecting section 6 receives a drive current and an optical output value (drive information signal S3) of the semiconductor laser 25 from the drive information obtaining section 4 (S 101). Then, the abnormality detecting section 6 compares the driving current and the optical output values of the semiconductor laser 25 with the reference values recorded in the reference value storing section 60, respectively (S102) (see FIG. 3).

Then the abnormality detecting section 6 determines whether or not a difference between (a) the driving current of the semiconductor laser 25 and the optical output values of the semiconductor laser 25 and (b) the reference value recorded in the reference value storing section 60 is not less than a designated threshold (S103).

In a case where both a difference between the drive current of the semiconductor laser 25 and the reference value and a difference between the optical output value of the semiconductor laser 25 and the reference value are less than the designated threshold (NO of S103), the abnormality detecting section 6 determines that there is no abnormality in the semiconductor laser 25. For example, suppose that a reference value of a drive current necessary for obtaining optical output of 5 mW is set to be 20 mA and that a difference between a detected drive current and the reference value (detected drive current−reference value) is set to be +2.5 mA. In this case, if the detected drive current is 20 mA, the abnormality detecting section 6 determines that there is no abnormality in the semiconductor laser 25 and ends the process.

On the other hand, at least one of the differences between the drive current of the semiconductor laser 25 and a reference value and between optical output of the semiconductor laser 25 and a reference value is not less than the designated threshold (YES of S103), the abnormality detecting section 6 determines that an abnormality has occurred in the semiconductor laser 25. For example, suppose that a reference value of a drive current necessary for obtaining optical output of 5 mW is set to be 20 mA and that a difference between a detected drive current and the reference value (detected drive current−reference value) is set to be +2.5 mA. In this case, if the detected drive current is 25 mA, the abnormality detecting section 6 judges that an abnormality has occurred in the semiconductor laser 25.

In this case, the abnormality detecting section 6 generates an abnormality detecting signal S5 and supplies the signal to the magnetic head control section 3 and the warning information output section 7

Such a series of processes in the abnormality detecting section 6 is carried out repeatedly at regular intervals or every time when the semiconductor laser 25 is turned on.

<Process in Drive Information Analyzing Section 8>

Next, a process in the drive information analyzing section 8 is described in detail. In the present embodiment, the drive information analyzing section 8 which is included in the information recording device 1 estimates a remaining life of the semiconductor laser 25. The following description discusses how the drive information analyzing section 8 estimates a remaining life of the semiconductor laser 25.

(General Characteristics of Semiconductor Laser 25)

Figure 4:
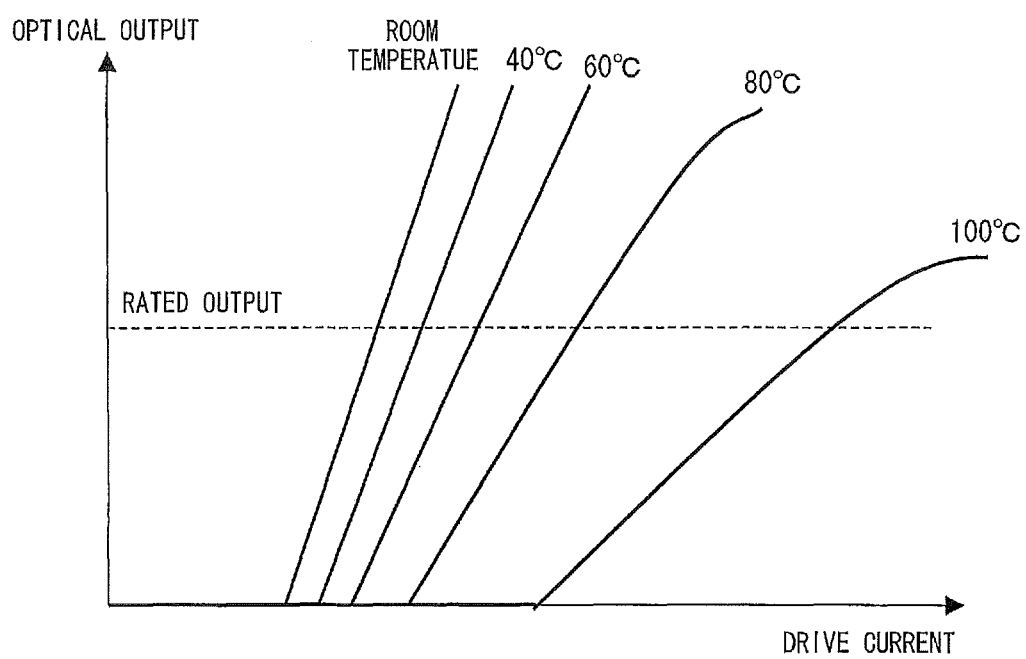
FIG. 4 is a graph showing temperature dependency of drive current—optical output characteristics of a common semiconductor laser.

Firstly, temperature dependency of a common semiconductor laser 25 is discussed with reference to FIG. 4. FIG. 4 is a graph showing temperature dependency of drive current-optical output characteristics of the common semiconductor laser 25. Under a state in which a low current is being applied, almost no optical output is obtained from the semiconductor laser 25. However, laser oscillation is caused once the current exceeds a given current value (oscillation threshold). This causes optical output to sharply increases with an increase in the drive current.

Consider a case where a current higher than an oscillation threshold is applied, and assume (differential efficiency)= (increased amount of optical output)/(increased amount of a drive current). In this case, the oscillation threshold increases with an increase in a drive temperature whereas the differential efficiency decreases. Namely, the drive current necessary for obtaining a given optical output (rated output) in order to record information in the disk medium 10 increases as the drive temperature increases.

Figure 5:
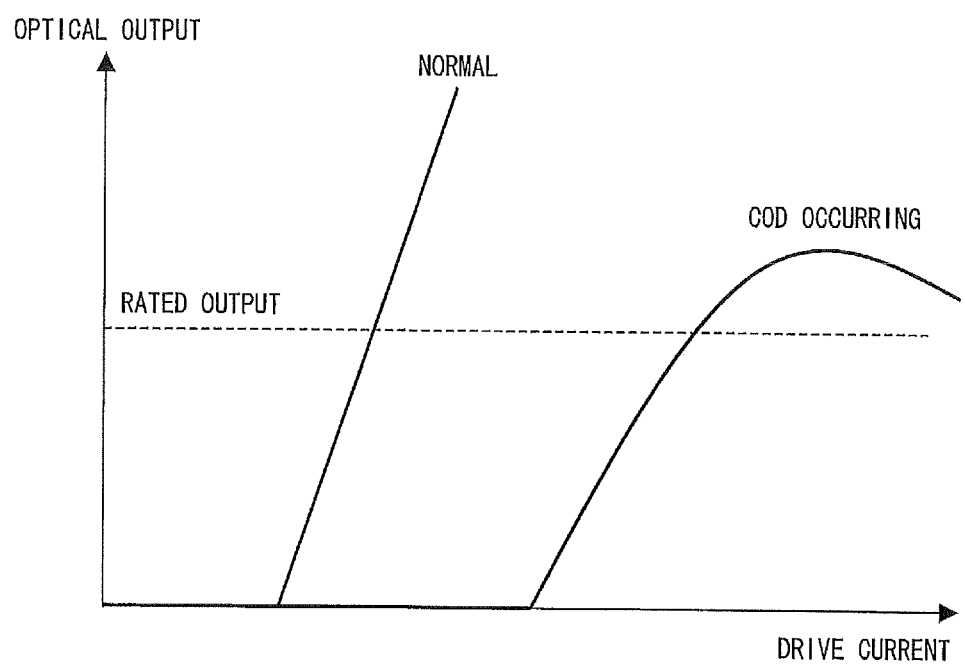
FIG. 5 is a graph showing drive current-optical output characteristics of a common semiconductor laser in a normal case and in a case where a catastrophic optical damage (COD) has occurred.

Next, an effect of deterioration in a characteristic of a common semiconductor laser 25 is discussed with reference to FIG. 5. FIG. 5 is a graph showing drive current-optical output characteristics of the common semiconductor laser 25 in a normal case and in a case where a catastrophic optical damage (COD) has occurred. The following description discusses COD as a kind of deterioration. However, the semiconductor laser 25 mostly shows the same tendency even if deterioration has been caused by another factor.

Input of a current much higher than a normal drive current of the semiconductor laser 25 melts the semiconductor laser 25 at its end part. The melting disturbs the crystal structure of the semiconductor laser 25 at the end part. This causes the semiconductor laser 25 to absorb light. Such phenomenon is called COD. If input of a large current into a semiconductor laser 25, which is due to instability or malfunctioning of a laser driver (the magnetic head control section 3) causes the COD, an oscillation threshold increases whereas differential efficiency decreases (see FIG. 5). Once the COD occurs, neither the oscillation threshold nor the differential efficiency is restored. This accelerates deterioration in the semiconductor laser 25.

Figure 6:
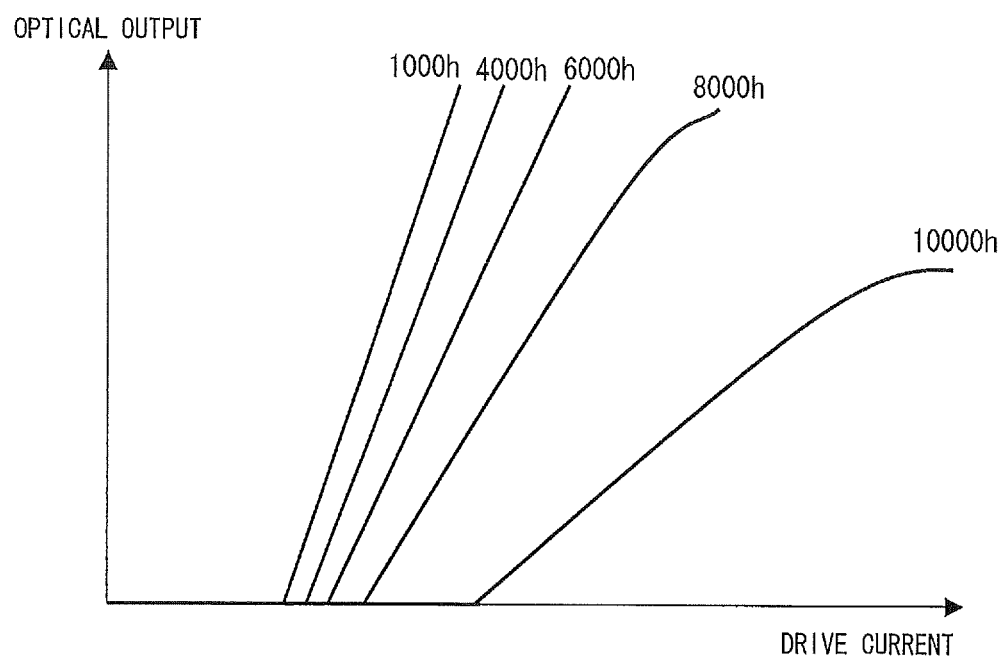
FIG. 6 is a graph showing changes in current-optical output, the changes caused by element drive time in a common semiconductor laser.
Figure 7:
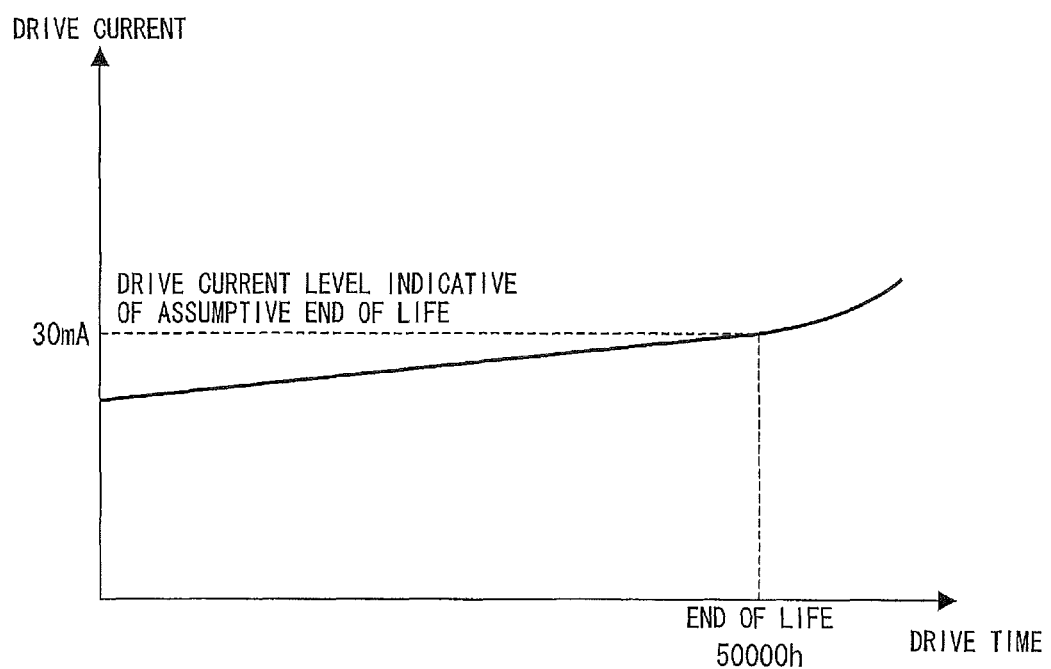
FIG. 7 is a graph showing drive time dependency of a drive current necessary for obtaining a given optical output in a common semiconductor laser.

Next, a change in a characteristic of the semiconductor laser 25 under normal usage is discussed with reference to FIGS. 6 and 7. FIG. 6 is a graph showing changes in current-optical output characteristics over drive time of a common semiconductor laser 25. FIG. 7 is a graph showing drive time dependency of a drive current that is necessary for obtaining a given optical output in the common semiconductor laser 25.

The common semiconductor laser 25 undergoes deterioration due to a spread of a local defect, oxidation of a crystal, repeated heating/cooling by a current or the like even in a case where the semiconductor laser 25 is used under a designated usage environment (ambient temperature) without exceeding a rated output. As drive time becomes longer, the oscillation threshold increases whereas differential efficiency decreases (see FIG. 6). Namely, a drive current necessary for obtaining a rated output under a given usage environment increases in accordance with drive time. If the semiconductor laser 25 is used under a constant temperature, the drive current increases as shown in FIG. 7.

Assume that a life of the semiconductor laser 25 is judged to have ended when a drive current necessary for obtaining a rated output reaches a previously set reference value (e.g., 30 mA for a rated output of 5 mW as shown in FIG. 7). In this case, if the drive current reaches 30 mA after a drive time of 50,000 hours, the life of the semiconductor laser is 50,000 hours.

(Principle of Remaining Life Estimation of Semiconductor Laser 25)

As described earlier, the characteristic (remaining life) of the semiconductor laser 25 depends on the usage environment. Deterioration in a device is generally caused by a chemical or physical process. Therefore, a chemical kinetics model is generally used as a relationship between a drive temperature and the life.

Specifically, dependency of the life affected by temperature stress with respect to a semiconductor device is used as the Arrhenius model in an accelerated life test. The present model can be used as an example of a process of estimating a remaining life, the process that uses a record of drive information (described below).

In view of the Arrhenius model, the relationship between a degree of device deterioration at a drive time t and a drive temperature is expressed by the following formula (1):

$$B(t) = A \int_0^t \exp\left(\frac{-Ea}{kT(t')}\right) dt' \quad (1)$$

where B(t) is the degree of device deterioration at a drive time t, A is proportionality constant, Ea is activation energy, K is the Boltzmann constant, and T(t') is a drive temperature at drive time t'.

Provided that the degree of deterioration B is proportional to an increased amount of a drive current necessary for obtaining a rated output ΔIop, the following formulas (2) and (3) hold between a drive current at the drive time t and a drive current at a drive time.

$$\Delta Iop(t) = A'B(t) \equiv C \int_0^t \exp\left(\frac{-Ea}{kT(t')}\right) dt' \quad (2)$$

$$Iop(t) = I\_0 + \Delta Iop(t) = I\_0 + C \int_0^t \exp\left(\frac{-Ea}{kT(t')}\right) dt' \quad (3)$$

where Iop(t) is the drive current at the drive time t, I_0 is the drive current at a drive time 0, and A' is a proportional constant, and where C is AA' and a newly set proportional constant.

Between a drive current which is regarded as the end of a life of the semiconductor laser 25 and the driving time (life), the following formula (4) holds.

$$Iopl = Iop(tl) = I\_0 + C \int_0^{tl} \exp\left(\frac{-Ea}{kT(t')}\right) dt' \quad (4)$$

where Iop1 is a drive current which is regarded as the end of a life of the semiconductor laser 25 and t1 is the driving time (life).

In a case where the drive temperature T is not constant, the value of drive temperature T is found by actual measurement or the like. In a case of actual measurement, the drive temperature T is hardly provided continuously, but discretely. For example, the drive temperature T is provided as a sampled data at given intervals. In this case, an integral of the formulas (2) to (4) is generally found by approximation. For example, in a case where a rectangle approximation is used, the formulas (2) to (4) are modified as the following formulas (2)' to (4)'. Note that p is a sampling number to drive time tp and n is a sampling number to an end of life of a semiconductor laser 25.

$$\Delta Iop(t) = C \sum_{k=1}^{n} (t_k - t_{k-1}) \exp\left(\frac{-Ea}{kT(t_k)}\right) \quad (2)'$$

$$Iop(t_p) = I\_0 + C \sum_{k=1}^{p} (t_k - t_{k-1}) \exp\left(\frac{-Ea}{kT(t_k)}\right) \quad (3)'$$

$$Iop(tl) = I\_0 + C \sum_{k=1}^{n} (t_k - t_{k-1}) \exp\left(\frac{-Ea}{kT(t_k)}\right) \quad (4)'$$

(Calculation Method of Remaining Life of Semiconductor Laser 25)

Next, a method of calculating a remaining life of the semiconductor laser 25 at a drive time tp is specifically discussed.

(A-1) Case where a known drive current Iop (tp) is used

Assuming that a drive current Iop (tp) at a given drive time tp is already known by actual measurement and that a drive temperature Tb is constant between the drive time tp and a drive time t1 (the end of a life), a formula (5) is obtained from the formulas (3) and (4).

$$tl - tp \equiv tj = \frac{Iopl - Iopt(tp)}{C \exp\left(\frac{-Ea}{kTb}\right)} \quad (5)$$

Here, it is possible to estimate a remaining life of the semiconductor laser 25 from the formula (5) since tj is the remaining life of the semiconductor laser 25.

(A-2) Case where a Record of a Drive Temperature is Used

Supposing that a record of a drive temperature to a given drive time tp is already known by an actual measurement and that a drive temperature Tb is constant between the drive time tp and a drive time t1, the formulas (4) to (6) hold.

$$tl - tp \equiv tj = \frac{Iopl - I\_0 - C \int_0^{tp} \exp\left(\frac{-Ea}{kT(t')}\right) dt'}{C \exp\left(\frac{-Ea}{kTb}\right)} \quad (6)$$

In a case where a rectangle approximation is used for finding an integral, the following formula (6)' holds.

$$tj = \frac{Iopl - I\_0 - C\sum_{k=1}^{p}(t_k - t_{k-1})\exp\left(\frac{-Ea}{kT(t_k)}\right)}{C\exp\left(\frac{-Ea}{kTb}\right)} \quad (6)'$$

It is possible to estimate a remaining life of the semiconductor laser 25 from the formula (6) or (6)'. In a case of either (A-1) or (A-2), if a drive temperature at a drive time tp is used as a drive temperature Tb, a remaining life of the semiconductor laser 25 to be estimated is a remaining life obtained in a case where the semiconductor laser 25 is continuously used at the drive temperature Tb for the rest of its life. In contrast, if an average drive temperature to a drive time t1 is used in accordance with a record of drive information, a remaining life to be estimated is a remaining life obtained in a case where the semiconductor laser 25 is continuously used under an average usage condition to the driving time t1.

As described above, in order to estimate a remaining life of the semiconductor laser 25 on the basis of formulas (5), (6), and (6)', it is necessary that a proportional constant C and an activation energy Ea have been found in some way. The following description discusses how to find the proportional constant C and the activation energy Ea.

(B-1) How to Find a Proportional Constant C and an Activation Energy Ea of a Remaining Life of the Semiconductor Laser 25 by Actual Measurement Firstly, the following description discusses how to find a proportional constant C and an activation energy Ea by actual measurement in a case where the semiconductor laser 25 is driven at a constant drive temperature and a constant optical output. In a case where the semiconductor laser is driven at a constant temperature and a constant optical output, the formula (2) is simplified to the following formula (7).

$$\Delta Iop(t) = tC\exp\left(\frac{-Ea}{kT}\right) \quad (7)$$

That is, since a degree of deterioration B is proportional to a drive time, the drive current Iop(t) of the formula (3) is also proportional to the driving time t. Thus the following formula (8) holds.

$$Iop(t) = I\_0 + tC\exp\left(\frac{-Ea}{kT}\right) \quad (8)$$

According to the formula (8), the drive current Iop is proportional to the drive time t under a constant drive temperature if a proportional constant C and an activation energy Ea are constant. In other words, the drive current Iop shows a change shown in FIG. 7. The activation energy Ea is constant unless a physical phenomenon that causes deterioration occurs. The activation energy Ea is generally not less than 0.4 eV and not more than 1.0 eV.

A proportional constant C and an activation energy Ea are two unknown numbers in the formula (7). Therefore, knowing respective lives (t1, t2) at two drive temperatures (T1, T2) enables to find the proportional constant C and the activation energy Ea. In a case where T1, T2, t1, and t2 are already known by an experiment etc., the following formulas (9)-1 and (9)-2 is obtained from the formula (8).

$$\Delta Iop(t1) = t1C\exp\left(\frac{-Ea}{kT1}\right) \quad (9)\text{-}1$$

$$\Delta Iop(t2) = t2C\exp\left(\frac{-Ea}{kT2}\right) \quad (9)\text{-}2$$

An activation energy Ea can be obtained from the following formula (10) by deforming the formulas (9)-1 and (9)-2 while deleting a proportional constant C.

$$Ea = k\left(\frac{1}{T2} - \frac{1}{T1}\right)^{-1}\frac{t2}{t1} \quad (10)$$

The proportional constant C can be obtained by substituting the activation energy Ea obtained from the formula (10) into the formula (9)-1 or the formula (9)-2.

This method is possible if a manufacturer of an information recording device 1 extracts a semiconductor laser 25 which is an identical type to the semiconductor laser 25 being mounted on the information recording device 1 and estimates respective lives at two different drive temperatures. A proportional constant C and an activation energy Ea thus measured are recorded in the registered value storing section 80 in advance, which enables to use the proportional constant C and the activation energy Ea for estimating a remaining life of the semiconductor laser 25.

(B-2) How to Find a Proportional Constant C and an Activation Energy Ea from a Record of Drive Information about a Drive Current and a Drive Temperature of the Semiconductor Laser 25

Next, the following description discusses how to find a proportional constant C and an activation energy Ea in a case where a record of drive information of the semiconductor laser 25 included in an information recording device 1 is used.

TABLE 1

| Total Drive Time t | Drive Current Iop | Drive Temperature T |
|---|---|---|
| 0 | 10.0 | 25.0 |
| t1 | 10.2 | 25.3 |
| t2 | 10.8 | 27.8 |
| t3 | 10.6 | 25.4 |
| t4 | 11.0 | 26.5 |
| . | . | . |
| . | . | . |
| . | . | . |

As Table 1 shows, measured values of a drive temperature t, a drive current Iop, and a drive temperature T are successively stored in the drive information storing section 5. A theoretical value of a drive current Iop at a drive time t1 can be obtained from the formulas (3) or (3)'. Therefore, fitting (e.g., least-squares method) of the measured values of a drive temperature t, a drive current Iop, and a drive temperature T by the formulas (3) or (3)' enables an estimation of the proportional constant C and the activation energy Ea. In this case, the fitting is carried out assuming that a proportional constant C and an activation energy Ea of the formula (3) and (3)' are unknown.

However, each of the above methods (B-1) and (B-2) has advantages and disadvantages. In a method (B-1), a smaller individual difference in a proportional constant C and an activation energy Ea in the semiconductor laser 25 enables more accurate estimation of a remaining life. In addition, a system is simplified since the proportional constant C and the activation energy Ea are obtained in advance.

On the other hand, in the method (B-2), even if there is an individual difference which is too great to ignore, it is possible to find a proportional constant C and an activation energy Ea for each semiconductor laser 25. This improves accuracy of estimation of a remaining life. However, it is necessary to calculate a proportional constant C and an activation energy Ea by fitting of measured data. This requires obtaining many proportional constants C and activation energy Ea so as to perform accurate calculation. In other words, more samplings need to be carried out. Moreover, a system in (B-2) becomes more complex than a system in (B-1) as a calculation cost of fitting increases.

In addition, in a case where the above method (B-2) is used for obtaining a proportional constant C and an activation energy Ea which are to be used to estimate a remaining life, accuracy of estimated life and meaning of the estimated life would possibly differ depending on measured data of a drive time t, a drive current Iop, and a drive temperature T, the measured data to be used for fitting.

Namely, using only a most recent data as measurement data enables to estimate a life which significantly takes influence of a factor in recent deterioration into account. For example, if an abnormality detecting signal S5 is supplied by an operation abnormality detecting process (described below) in the detecting section 6, it is possible to estimate a life that takes the abnormality which has occurred in the semiconductor laser 25 into account. In this case, the estimation is carries out by using a proportional constant C and activation energy Ea obtained by using only measured data obtained after the abnormality detecting signal S5 was outputted. This makes it possible to improve accuracy of estimation of a remaining life.

Note that a method of finding a proportional constant C and a activation energy Ea is not limited to the methods mentioned above, and another method may be used. The fact is that using a proportional constant C and a activation energy Ea obtained by a plurality of above methods enables to improve accuracy of estimation of a remaining life.

For example, a comparison between (i) a remaining life of a semiconductor laser 25 calculated by using a proportional constant C and activation energy Ea which have been obtained by the above method (B-1) and (ii) a remaining life of the semiconductor laser 25 calculated by using a record of drive information in the above method (B-2) enables estimation of an individual difference in a characteristic of the semiconductor laser 25. Furthermore, a comparison between (a) an estimated life calculated by the above method (B-2) with respect to only a part of drive time (measured data region) and (b) an estimated life calculated by using all data makes it possible to take influence of unexpected deterioration into account.

For example, assume that the number of points of measuring data from time 0 to a given drive time ta is 100 in total. If a remaining time from drive time ta calculated by using drive information for the first 10 points from the drive time 0 (from the drive times 0 to tb) is longer than an estimated remaining life in accordance with a record of all drive information, it can be conclude that irreversible deterioration has been caused between the drive times tb and ta by a factor such as influence of external noise or the like.

The above description discusses the cases in which the semiconductor laser 25 has constant optical output. However, in an actual information recording medium 1, it is necessary to maintain output of near-field light with which the disk medium 10 is irradiated to be constant. Therefore, in a case where a section other than the semiconductor laser 25, for example, the near-field light emitting section 27 shows deterioration over time and conversion efficiency to near-field light changes as time goes by, it is necessary to change optical output of the semiconductor laser 25 in accordance with the change.

In this case, a life can be estimated from the formula (3) by measuring a relationship between different optical output and a drive current Iop (I-P characteristics) a plurality of times and storing the information in the drive information storing section 5 each time of the measurement.

For example, in a case in which optical output of the semiconductor laser 25 which is necessary in a case of a most serious deterioration is estimated to be 10 mW, a drive current Iop and a drive temperature when optical output is between 1 mW and 10 mW are measured and stored in the drive information storing section 5, at the drive time 0. Then, in the same way, a drive current Iop and a drive temperature when optical output are between 1 mW and 10 mW are measured and stored in the drive information storing section 5 at a given intervals. Repetition of this operation makes it possible to store drive current data under a plurality of different optical output. Therefore, the above method enables estimation of a remaining life under different optical output.

In addition, instead of measuring a drive current Iop and a drive temperature corresponding to a plurality of optical output as described above, a life of an element under each of a plurality of optical output may be measured in advance by a sampling inspection that is conducted by a manufacturer in a factory so that the value thus measured is utilized.

Moreover, as another method, it is possible to estimate a life by using a proportional constant C and an activation energy Ea obtained from a latest measured data in which optical output can be judged to be constant, the proportional constant C and the activation energy Ea having been obtained by the above method (B-2).

Necessary optical output of near-field light can be found by, for example, test light. The test light is such that a region for test record is determined in a specified region of the disk medium 10 so that test recording is performed while changing output of the semiconductor laser 25 and intensity of a magnetic field of the magnetic field generating section 24. Then, test record data thus recorded is read by the reading section 22 so as to check a signal quality of the read data. This enables to estimate an optimum recording condition (optical output and intensity of a magnetic field).

Note that the above light estimation method and the above test light method are not limited to the above methods, and another method may be used. Furthermore, the above light estimation method and the above test light method may be used with the life estimation by SMART which has been used in a conventional hard disk. In this case, it is possible to estimate a remaining life while taking a degree of deterioration in a member other than the semiconductor laser 25 into account. In addition, the above estimation method in which a remaining life is estimated by using a characteristic of the semiconductor laser 25 may be integrated into SMART as a part of SMART so as to serve as means of estimating a remaining life of a hard disk.

<Operation of Information Recording Device 1>

Figure 8:
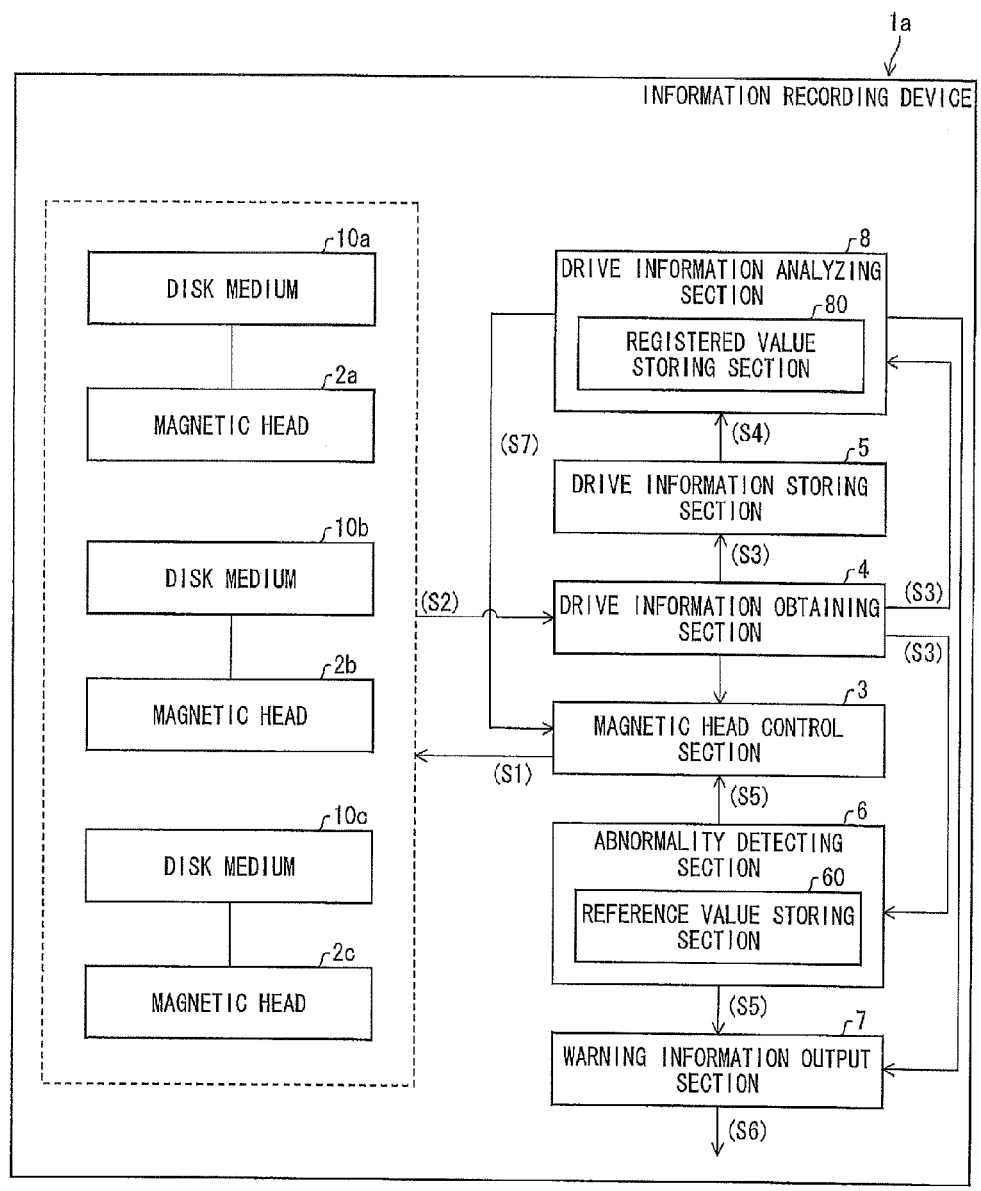
FIG. 8 is a block diagram showing an arrangement of relevant parts of an information recording device in accordance with a modification of the first embodiment.

Next, the following description specifically discusses an operation of the information recording device 1 in a case where an abnormality is detected in a semiconductor laser 25 and an operation of the information recording device 1 using a remaining life of the semiconductor laser 25 with reference to FIG. 8.

FIG. 8 is a block diagram showing an arrangement of relevant parts of the information recording device 1 in accordance with a modification of the present embodiment. An information recording device 1a includes three disk media 10a to 10c and corresponding three magnetic heads 2a to 2c which are capable of recording/reading (see FIG. 8).

Operation of the Information Recording Device 1a in a Case where an Abnormality is Detected in the Semiconductor Laser 25

Operation Example 1-1

In the information recording device 1a that includes a plurality of magnetic heads 2a to 2c, if an abnormality is detected in at least one semiconductor laser 25 of the semiconductor lasers 25 included in the magnetic heads 2a to 2c, the magnetic head control section 3 stops writing new data into a disk corresponding to a magnetic head which includes the at least one semiconductor laser 25 in which an abnormality has been detected. In this case the magnetic head control section 3 only rewrites the disk medium. Alternatively, the magnetic head control section 3 prohibits writing/rewriting to the disk medium in which the abnormality has been found and makes the disk medium read only. This enables stable recording of information and therefore improves recording reliability of the information recording device 1a.

Operation Example 1-2

In addition, in the information recording device 1a that includes a plurality of magnetic heads 2a to 2c, if the abnormality detecting section 6 detects an abnormality in at least one semiconductor laser 25 of the semiconductor lasers 25 included in the magnetic heads 2a to 2c, the abnormality detecting section 6 generates an abnormality detecting signal S5. The abnormality detecting section 6 then supplies the abnormality detecting signal S5 to the warning information output section 7 so that the warning information is displayed on the display section or the like.

Operation Example 1-3

Moreover, suppose that the information recording device 1a includes outward warning means (e.g., an LED lamp and sound output device). If the abnormality detecting section 6 detects an abnormality in at least one semiconductor laser 25 of the semiconductor lasers 25 included in the magnetic heads 2a to 2c, a message that urges data transfer to another information recording device may be displayed. Alternatively, a warning sound may be emitted to inform a user that the abnormality has been detected.

Operation of the Information Recording Device 1a Using a Remaining Life of a Semiconductor Laser 25

Operation Example 1-4

In the information recording device 1a that includes a plurality of magnetic heads 2a to 2c, if an instruction for writing new information is inputted to the magnetic head control section 3, the magnetic head control section 3 compares respective remaining lives of semiconductor lasers 25, the remaining lives being indicated in the analyzing signal S7 supplied from the drive information analyzing section 8. The magnetic head control section 3 then chooses a disk corresponding to a magnetic head, of the magnetic heads 2a to 2c, which includes a semiconductor laser 25 with the longest remaining life and records data in the disk medium. This enables stable recording of information and therefore improves recording reliability of the information recording device 1a.

Operation Example 1-5

Furthermore, if a remaining life of at least one semiconductor laser 25 of semiconductor lasers 25 included in a plurality of magnetic head 2a to 2c falls below a previously set time (e.g., 1,000 hours), the magnetic head control section 3 may stop writing new data to a disk corresponding to a magnetic head which includes the at least one semiconductor laser 25. In this case, the magnetic head control section 3 only rewrites the magnetic head so that the magnetic head is used less frequently.

Operation Example 1-6

In addition, if at least one semiconductor laser 25 of semiconductor lasers included in a plurality of magnetic heads 2a to 2c reaches the end of its life, the magnetic head control section 3 may prohibit writing/rewriting to a disk corresponding to a magnetic head which includes the at least one semiconductor laser 25 and make the disk medium read only.

Modification 1

The above description discusses, as a characteristic of a semiconductor laser 25, the arrangement in which the information recording device 1 estimates a remaining life of the semiconductor laser 25. However, the present invention is not limited to this. For example, the drive information analyzing section 8 may be arranged to estimate a degree of deterioration in the semiconductor laser 25.

In this case, the drive information analyzing section 8 estimates a degree of deterioration in the semiconductor laser 25 by determining whether or not the deterioration in the semiconductor laser 25 is in accordance with the Arrhenius model. If the deterioration in the semiconductor 25 is in accordance with the Arrhenius model, a theoretical value of a drive current at a given drive time tp can be obtained from the formulas (3) and (3)'.

Comparison between a value obtained from the formula (3) or (3)' and a measured value of a drive current Iop makes it possible to identify a difference in a drive current from the theoretical value. This difference has been caused by deterioration other than deterioration generated by external noise etc. when the semiconductor laser 25 is driven under a normal usage condition. That is, the difference has been caused by an unexpected deterioration factor.

With this difference, it is possible to determine an existence of a deterioration factor other than variation in characteristics of the semiconductor laser 25 and drive temperature (e.g., power supply noise). For example, in a case where a drive current Iop of the semiconductor laser 25 at drive time tp is significantly higher than a theoretical value estimated from the formulas (3) and (3)', it can be estimated that unintentional contamination of powerful current (e.g., power supply noise) has caused unexpected deterioration in the semiconductor laser 25.

Moreover, it is possible to grasp a chronological history of a difference between a measured value of a drive current Iop and a theoretical value of a drive current Iop by referring to a record of the drive current Iop. This helps determine whether deterioration in the semiconductor laser 25 has been caused by steadily factor or unsteady factor.

With reference to the information recording device 1a shown in FIG. 8, the following description discusses examples of an operation of the information recording device 1 using a degree of deterioration in each semiconductor laser 25, the degree of deterioration estimated by the above methods.

Operation Example 2-1

In the information recording device 1a that includes a plurality of magnetic heads 2a to 2c, if an instruction for writing new data is inputted to the magnetic head control section 3, the magnetic head control section 3 compares respective degrees of deterioration in the semiconductor lasers 25 of magnetic heads 2a to 2c which are indicated in an abnormality detecting signal S5 supplied from the abnormality detecting section 6. The magnetic head control section 3 then chooses a disk corresponding to a magnetic head, of the magnetic heads 2a to 2c, which includes a semiconductor laser 25 with the least deterioration so as to perform a recording operation. This improves recording reliability of the information recording device 1a.

Operational Example 2-2

Furthermore, if a value indicating a degree of deterioration in at least one semiconductor laser 25 of semiconductor lasers 25 which are included in a plurality of magnetic heads 2a to 2c exceeds a previously set reference value (e.g., 50% difference from a theoretical value), the magnetic head control section 3 may stop writing new data to a disk corresponding to a magnetic head including the at least semiconductor laser 25. In this case, the magnetic head control section 3 only rewrites the disk medium so as to avoid using the semiconductor laser 25 as much as possible. Alternatively, the magnetic head control section 3 may prohibit writing/rewriting to the disk medium that corresponds to the magnetic head including the semiconductor laser 25 and make the disk medium read only.

Modification 2

The above description discusses the arrangement in which a general photodiode is used as a light receiving element 26. However, the present invention is not limited to this. For example, the present invention may use a spectral element 26a instead of the light receiving element 26.

Figure 9:
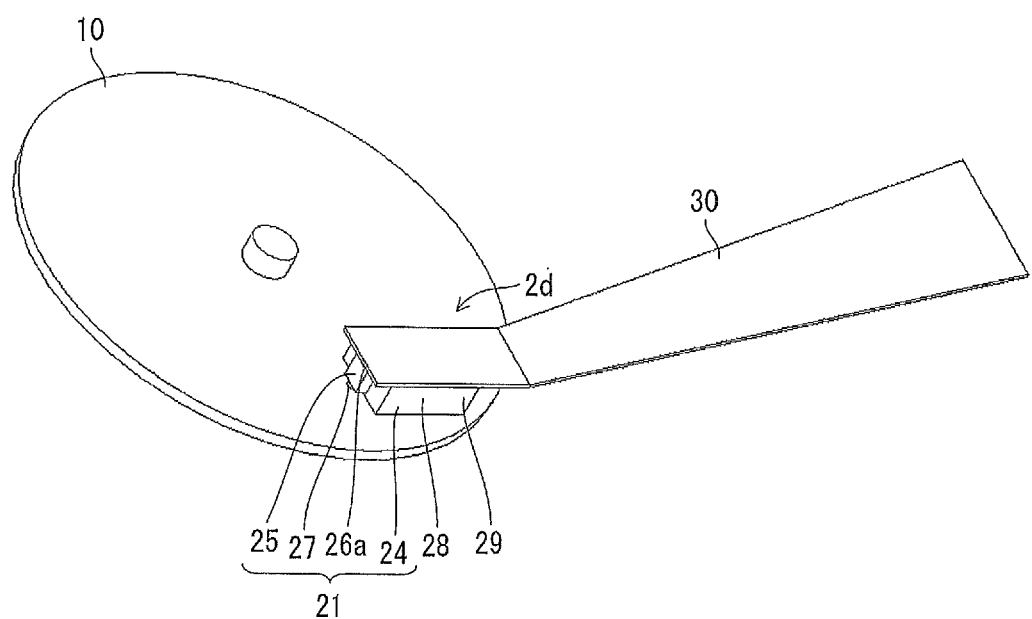
FIG. 9 is a perspective view showing an external configuration of a magnetic head that includes a spectral element.

FIG. 9 is a perspective view showing a magnetic head 2d that includes a spectral element 26a. The magnetic head 2d includes the spectral element 26a instead of a light receiving element 26 (see FIG. 9). The spectral element 26a, for example, has an arrangement in which a photonic crystal or the like is combined with a photodiode array so that both wavelengths of incident light and optical output for each wavelength can be measured.

If a whole oscillation wavelength region of light emitted from a semiconductor laser 25 is covered by a detecting region of the spectral element 26a, it is possible to convert the measured optical output of the full wavelength into optical output of the semiconductor laser 25 by integrating the measured optical output with respect to the wavelength.

The following description discusses a relationship between a drive temperature of a semiconductor laser 25 and wavelength of the semiconductor laser 25. In general, a band gap and a refractive index of a semiconductor laser 25 vary depending on a drive temperature. Energy distribution (quasi-Fermi distribution) of a carrier present in a semiconductor also varies depending on the drive current. Moreover, since a resonator structure which constitutes the semiconductor laser 25 and gain spectrum change with drive temperatures, emission wavelength of the semiconductor 25 varies depending on a temperature of its emission layer.

Figure 10:
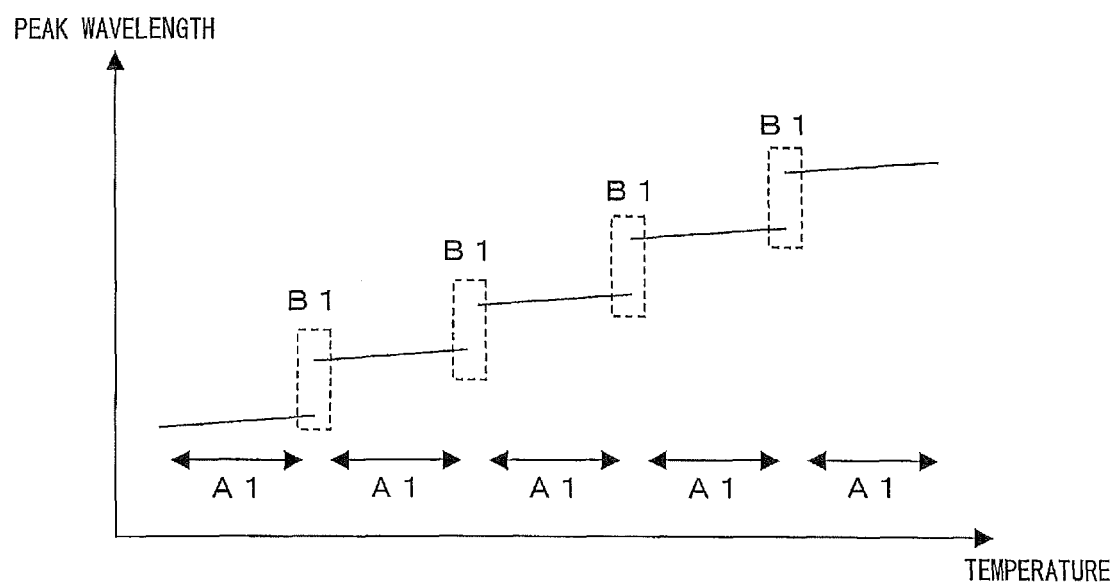
FIG. 10 shows a relationship between an oscillation peak wavelength and a drive temperature of a common semiconductor laser.

FIG. 10 shows a relationship between an oscillation peak wavelength and a drive temperature of a common semiconductor laser 25. The oscillation peak wavelength of the semiconductor laser 25 is generally on a resonator mode which has the largest gain (see FIG. 10). FIG. 10 shows a state in which continuous change with respect to a temperature shown in region A1 and gradual change of wavelength shown in the region B1 coincide.

The region A1 is generated by a change in mode position, the change caused by a change in refractive index of the resonator whereas the region B1 is generated when the resonator mode which has the largest gain switches to an adjacent mode (mode hopping). An oscillation peak wavelength of the semiconductor laser 25 nearly evenly matches with a drive temperature of the semiconductor laser 25. In other words, it is possible to measure a drive temperature of the semiconductor laser 25 from an oscillation peak of the semiconductor laser 25. Accordingly, it is possible to use a drive temperature measured by this method in order to carry out the above estimation of a remaining life of the semiconductor laser 25.

Second Embodiment

Figure 11:
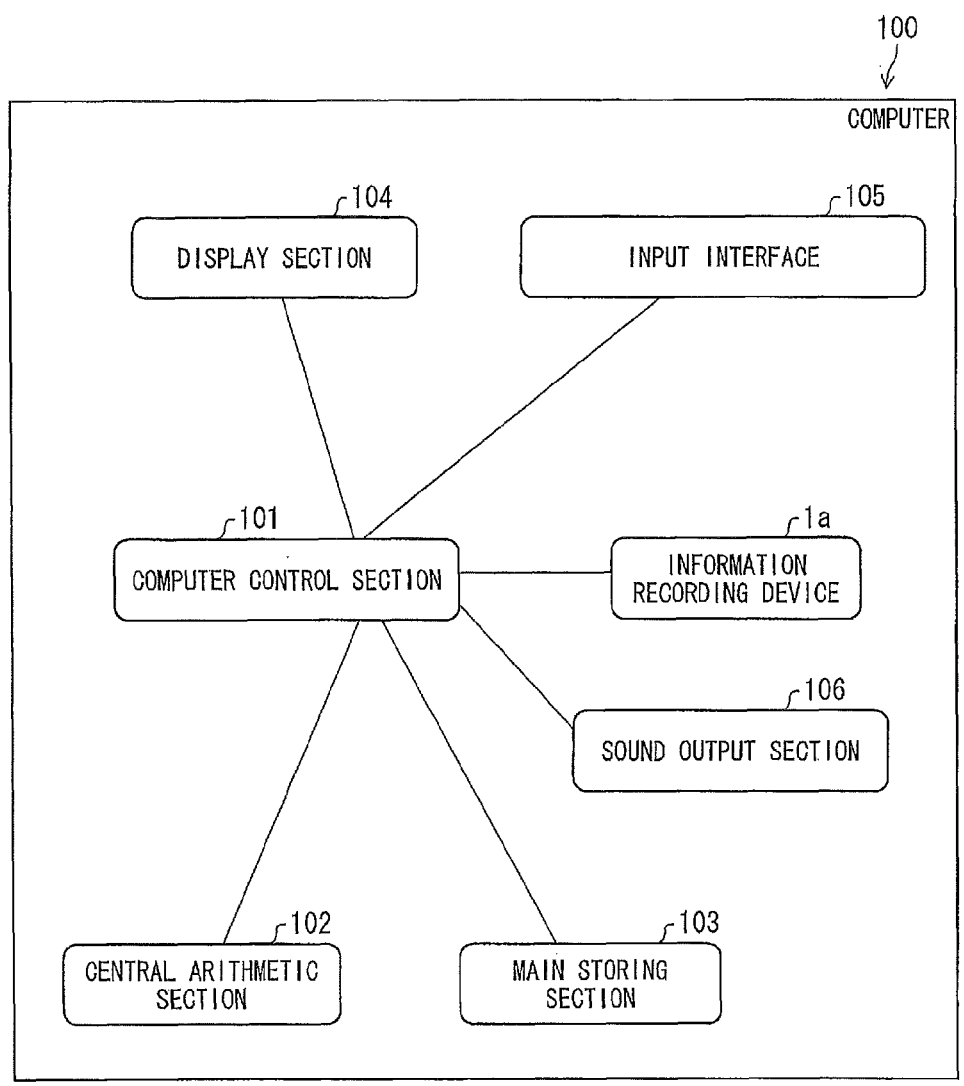
FIG. 11 is a block diagram showing an arrangement of relevant parts of a computer in accordance with the second embodiment.

The following description discusses another embodiment of the information recording device of the present invention with reference to FIG. 11.

Note that the same reference numerals are provided to members having the same functions as those in the drawings discussed in the first embodiment, for convenience of explanation.

The present embodiment discusses a case in which the information recording device 1a shown in FIG. 8 which is discussed in the first embodiment is applied to a computer 100. The computer 100 is exemplified by a PC and used for calculation, data processing, the Internet, email and the like.

<Arrangement of Computer 100>

FIG. 11 is a block diagram showing an arrangement of relevant parts of the computer 100 in accordance with the present embodiment. The computer 100 includes an information recording device 1a, a computer control section 101, a central arithmetic section 102, a main storing section 103, a display section 104, and an input interface 105 (see FIG. 11).

The computer control section 101 is connected to each of the sections constituting the computer 100 (the information recording device 1a, the central arithmetic section 102, the main storing section 103, the display section 104, and the input interface 105, which constitute the computer 100) so as to control an operation of each section.

The information recording device 1a is arranged as one part of the computer 100, and the computer control section 101 controls the information recording device 1a to input/output and operate. The information recording device 1a that records information inside the computer 100 estimates a remaining life and a degree of deterioration in a semiconductor laser 25 which is included inside.

<Operation of Computer 100>

Next, the following description specifically discusses examples of operation of the computer 100. The information recording device 1a included in the computer 100 performs the following operation. Note that any one of the following operations and the operations discussed in the first embodiment may be performed. Alternatively, two operations or more may be performed together.

Operation Example 3-1

When a remaining life of the semiconductor laser 25 estimated by the drive information analyzing section 8 included in the information recording device 1a goes under a threshold (e.g., 1,000 hours) stored in the registered value storing section 80, the drive information analyzing section 8 causes the warning information output section 7 to supply a warning signal S6 to the computer control section 101. Then the calculation control section 101 which received the warning signal S6 from the warning information output section 7 controls the display section 104 to display a message that urges an exchange of the information recording device 1a or a message that urges backups of data or transfer of data to another information recording device. Alternatively, the computer control section 101 controls a sound output section 106 to emit a warning sound.

Operation Example 3-2

In a case where the information recording device 1a includes separate outward warning means (e.g., an LED lamp and sound output device), the computer 100 may be configured such that, when an estimated remaining life of the semiconductor laser 25 goes under a threshold (e.g., 1,000 hours) stored in the registered value storing section 80, the drive information analyzing section 8 may cause a message that urges an exchange of the information recording device 1a or a message that urges backups of data or transfer of data to another information recording device to be displayed through the warning means. Alternatively, a warning sound is emitted to inform a user that an estimated remaining life of the semiconductor laser 25 has gone under a threshold.

Operation Example 3-3

In addition, the computer control section 101 may be arranged to automatically choose a disk medium corresponding to a magnetic head, of magnetic heads 2a to 2c which are included in the information recording device 1a, the magnetic head including a semiconductor laser 25 with the longest remaining life. The computer control section 101 then controls the disk medium to perform a recording operation. This enables stable recording of information and therefore improves recording reliability of the computer 100.

Operation Example 3-4

Furthermore, the computer 100 may be configured such that, when a remaining life of a semiconductor laser 25, the remaining life estimated by the drive information analyzing section 8 which is included in the information recording device 1a goes under a threshold (e.g., 1,000 hours) stored in the registered value storing section 80, the computer control section 101 stops writing new data into a disk corresponding to a magnetic head which includes the semiconductor laser 25 so that only rewriting is performed.

Operation Example 3-5

Moreover, the computer 100 may be configured such that, when at least one semiconductor laser 25 of the semiconductor lasers 25 included in a plurality of magnetic heads 2a to 2c, the plurality of magnetic heads 2a to 2c being included in the information recording device 1a, reaches the end of its life, the computer control section 101 prohibits the information recording device 1a from writing/rewriting to a disk corresponding to a magnetic head which includes the at least one semiconductor laser 25 and make the disk medium read only. Alternatively, the computer control section 101 may transfer information recorded in the disk medium to the two other disk media or an information recording device (not illustrated) which is arranged separately.

Third Embodiment

Figure 12:
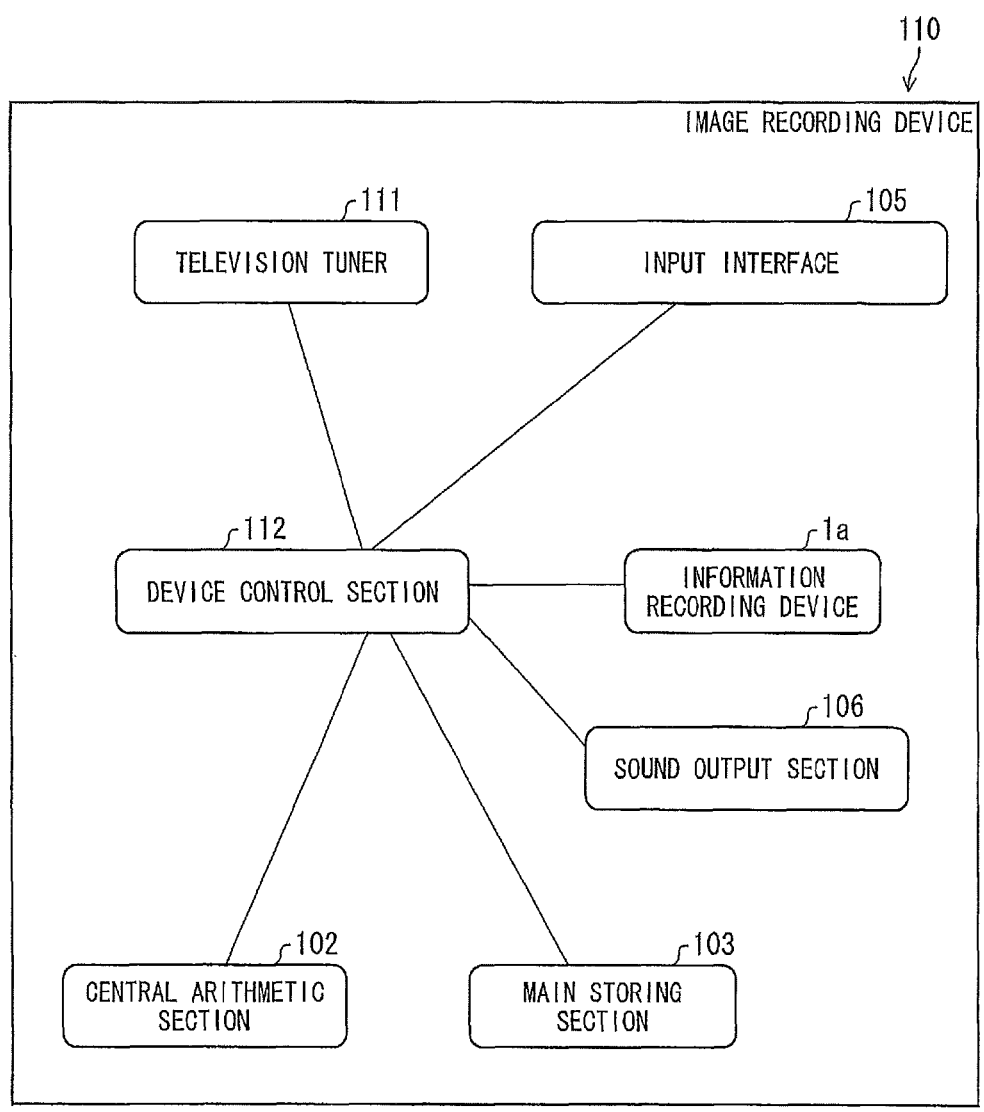
FIG. 12 is a block diagram showing an arrangement of relevant parts of an image recording device in accordance with the third embodiment.
Figure 13:
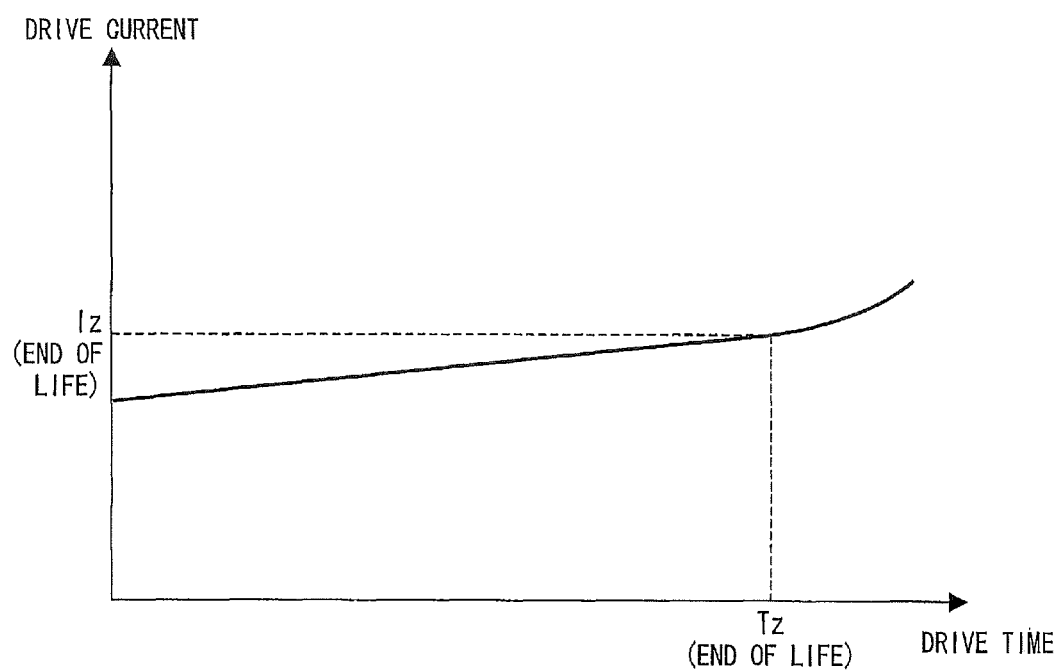
FIG. 13 is a graph showing a relationship between a drive time and a drive current of a common semiconductor laser.

The following description discusses another embodiment of the information recording device in accordance with the present invention with reference to FIG. 12.

Note that the same reference numerals are provided to members having the same functions as those in the drawings discussed in the first and second embodiments, for convenience of explanation.

The present embodiment discusses a case in which the information recording device 1a shown in FIG. 8 which is discussed in the first embodiment is applied to an image recording device 110. The image recording device is mainly used for recording and reading of an image.

<Arrangement of Image Recording Device 110>

FIG. 12 is a block diagram showing an arrangement of relevant parts of the image recording device 110 in accordance with the present embodiment. The image recording device 110 includes an information recording device 1a, a central arithmetic section 102, a main storing section 103, an input interface 105, a sound output section 106, a television tuner 111, and a device control section 112.

The television tuner 111 receives television signals and separates, from the television signals, a television signal of a channel chosen by a user. The television signal thus separated is converted to an image by the device control section 112 and then recorded in the information recording device 1a.

The information recording device 1a which records information inside the image recording device 110 estimates a remaining life of a semiconductor laser 25 included inside and a degree of deterioration in the semiconductor laser 25 included inside.

<Operation of Image Recording Device 110>

Next, the following description specifically discusses examples of an operation of the image recording device 110. The information recording device 1a which is included in the image recording device 110 performs the following operation. Note that any one of the following operations and the operations discussed in the first embodiment may be performed. Alternatively, two operations or more may be performed together.

Operation Example 4-1

When a remaining life of a semiconductor laser 25 estimated by the drive information analyzing section 8 included in the information recording device 1a goes under a threshold (e.g., 1,000 hours) stored in the registered value storing section 80, the drive information analyzing section 8 causes the warning information output section 7 to output a warning signal S6 to the device control section 112. Then the device control section 112 which received the warning signal S6 from the warning information output section 7 controls the sound output section 106 to emit a warning sound.

Operation Example 4-2

In addition, the device control section 112 may be arranged to automatically choose a disk corresponding to a magnetic head, of magnetic heads 2a to 2c, which includes a semiconductor laser 25 with the longest remaining life and control the disk medium to perform a recording operation. This enables stable recording of information and therefore improves recording reliability of the image recording device 110.

Operation Example 4-3

Furthermore, when a remaining life of a semiconductor laser 25, the remaining life estimated by the drive information analyzing section 8 included in the information recording device 1a goes under a threshold (e.g., 1,000 hours) stored in the registered value storing section 80, the device control section 112 may stops writing new data into a disk corresponding to a magnetic head which includes the semiconductor laser 25 so that only rewriting is performed.

Operation Example 4-5

Moreover, when at least one semiconductor laser 25 of the semiconductor lasers 25 included in a plurality of magnetic heads 2a to 2c, the plurality of magnetic heads 2a to 2c being included in the information recording device 1a, reaches the end of its life, the device control section 112 may prohibit the information recording device 1a from writing/rewriting to a disk corresponding to a magnetic head which includes the semiconductor laser 25 and make the disk medium read only. Alternatively, the device control section 112 may transfer information recorded in the disk medium to two other disk media or an information recording device (not illustrated) which is arranged separately.

Summary of Embodiments

As described above, the information recording device in accordance with the present invention includes: a head section that includes a light emitting element for heating a magnetic recording medium capable of recording information, and a magnetic field generating element for recording information in the magnetic recording medium; a drive information obtaining section for obtaining, as a drive information of the light emitting element, a drive condition in which the light emitting element is operating; a drive information storing section that is capable of storing therein the drive information thus obtained by the drive information obtaining section; and a head control section that controls an operation of the head section.

According to the above arrangement, the information recording device in accordance with the present invention therein drive information (e.g., a drive temperature, a drive current, optical output, the number of seeking, and the number of reading errors), the drive information having been obtained by the drive information obtaining section. Therefore, according to the above arrangement, it is possible to refer to past drive information of a light emitting element. This makes it possible to add a new function to the information recording device by applying an application that uses (utilizes) the record of drive information.

For example, it is possible to estimate a degree of load having been generated in a light emitting element in the past in accordance with a record of drive information, the drive information having been stored in the drive information storing section. This makes it possible to accurately estimate a remaining life of the light emitting element, a current degree of deterioration, and the like.

As described above, the above arrangement makes it possible to grasp a state of a light emitting element by using drive information. Accordingly, it is possible to control the head in accordance with the state of the light emitting element so as to prevent wrong information from being recorded.

Thus, according to the above arrangement, it is possible to realize an information recording device with high recording reliability.

The information recording device in accordance with the present invention is preferably such that the head section further includes a reading element for reading information recorded in the magnetic recording medium.

According to the above arrangement, it is possible for one (1) head section to record and read information recorded in a recording medium. This makes it possible to downsize the information recording device. Furthermore, it is possible to make an arrangement of the information recording device simpler than an arrangement of the information recording device in which a recording system and a reading system are arranged separately.

The information recording device in accordance with the present invention including a plurality of the head sections, the information recording device is preferably such that the head control section controls the head sections separately.

The information recording device in accordance with the present invention is preferably such that the head control section controls the head sections in accordance with the drive information so that each of the head sections operates differently.

The above arrangement enables control with combination of operations of a plurality of head sections. Thus, for example, it is possible to use different head sections in accordance with a state of the light emitting element.

That is, according to the above arrangement, it is possible to grasp a state of each light emitting element by using drive information and use different head sections in accordance with the state of each light emitting element. This makes it possible to take an advance measure against a malfunction in accordance with the state of each light emitting element. This further improves recording reliability of the information recording device compared with an arrangement which includes only one (1) head section.

Note that Patent Literatures 3 and 4 do not assume an arrangement which includes a plurality of head sections. Therefore, unlike the above arrangement, it is impossible to take an advance measure against a malfunction by using a plurality of head sections.

The information recording device in accordance with the present invention further including a drive information analyzing section for analyzing the drive information and estimating a characteristic regarding a functional impairment of the light emitting element, the information recording device is preferably such that the drive information analyzing section outputs the characteristic thus estimated to the head control section, and the head control section controls an operation of the head section in accordance with the characteristic thus outputted from the drive information analyzing section.

The above arrangement further includes the drive information analyzing section that estimates a characteristic regarding a functional impairment of the light emitting element. The characteristic regarding a functional impairment of the light emitting element here is exemplified by a remaining life of the light emitting element, a degree of deterioration in the light emitting element or the like.

According to the above arrangement, the drive information analyzing section estimates a characteristic such as a remaining life of the light emitting element, a degree of deterioration in the light emitting element or the like, and outputs the characteristic to the head control section. This enables the head control section to control the head in accordance with the characteristic.

The information recording device in accordance with the present invention is preferably such that the drive information analyzing section estimates the characteristic in accordance with the drive information outputted from the drive information obtaining section.

According to the above arrangement, it is possible to estimate a characteristic of a light emitting element in accordance with the latest drive information obtained by the drive information obtaining section. This makes it possible to estimate an unexpected influence such as influence of noise contamination or the like.

Moreover, the information recording device in accordance with the present invention is preferably such that the drive information analyzing section estimates the characteristic in accordance with the drive information stored in the drive information storing section.

According to the above arrangement, it is possible to estimate a characteristic of a light emitting element in accordance with a record of drive information stored in the drive information storing section. This makes it possible to estimate deterioration over time or the like.

The information recording device in accordance with the present invention is preferably such that the drive information analyzing section estimates the characteristics in accordance with the drive information outputted from the drive information obtaining section and the drive information stored the drive information storing section.

The above arrangement enables the drive information analyzing section to estimate a characteristic of the light emitting element in accordance with the latest drive information having been outputted from the drive information obtaining section and a record of drive information stored in the drive information storing section.

Therefore, according to the above arrangement, it is possible to estimate a characteristic of the light emitting element which characteristic has been affected by both a short-term event such as an unexpected noise and a long-term event caused by deterioration over time. This enables a more accurate estimation of a characteristic of the light emitting element.

The information recording device in accordance with the present invention is preferably such that the characteristic is a remaining life of the light emitting element.

The above arrangement enables the head control section to obtain a remaining life of the information recording device. Therefore, the head control section can control the head section most appropriately in accordance with the remaining life of the light emitting element.

Moreover, the information recording device in accordance with the present invention is preferably such that the characteristics is whether or not there is deterioration in the light emitting element, the deterioration having been caused by an unexpected deterioration factor.

The above arrangement enables the head control section to obtain deterioration in the light emitting element, the deterioration having been caused by an unexpected deterioration factor. Therefore, the head control section can control the head section most appropriately depending on whether or not there is deterioration caused by unexpected noise contamination or the like.

The information recording device in accordance with the present invention is preferably such that the estimation of whether or not there is deterioration in the light emitting element, the deterioration having been caused by the unexpected deterioration factor is carried out by comparing (a) a remaining life of the light emitting element, the remaining life being estimated from a first group of drive information stored in the drive information storing section, the first group being stored in the drive information storing section in a period from 90% of a storing period to a point when the estimation is carried out with (b) a remaining life of the light emitting element, the remaining life being estimated in accordance with a second group of the drive information stored in the drive information storing section, the second group being stored in the drive information storing section in a period from a point when storing was started to less than 10% of the recording period, where the storing period is a period from the point when storing was started to the point when the estimation is carried out.

According to the above arrangement, it is possible to estimate an existence of an unexpected deterioration factor such as noise contamination from the time of shipment to the present time.

The information recording device in accordance with the present invention is preferably such that when a value indicating the characteristic exceeds a designated threshold, the drive information analyzing section controls a warning information output section to outputs warning information informing a user that the value indicating the characteristic has exceeded the designated threshold.

Suppose that a remaining life of the light emitting element is estimated as a characteristic of the light emitting element by the drive information analyzing section and that a remaining life of 1,000 hours has been registered as a threshold. According to the above arrangement, when an estimated remaining life of the light emitting element goes under 1,000 hours, the drive information analyzing section controls a warning information output section to outputs warning information informing a user that the estimated remaining life of the light emitting element goes under 1,000 hours. For example, the drive information analyzing section can inform a user that a remaining life of the light emitting element has gone under 1,000 hours by causing the display section to display a warning screen.

The information recording device in accordance with the present invention is preferably such that when a value indicating the characteristic of the light emitting element exceeds a designated threshold, the head control section changes the operation of the head section including the light emitting element, from a normal operation to another operation.

Suppose that a remaining life of the light emitting element is estimated as a characteristic by the drive information analyzing section and a remaining life of 1,000 hours has been registered as a threshold. According to the above arrangement, when an estimated remaining life of the light emitting element goes under 1,000 hours, the head control section limits an operation of the head section and makes a backup of information.

Therefore, the above arrangement not only slows down deterioration in a light emitting element but also protects information stored in a magnetic storing section.

The information recording device in accordance with the present invention is preferably such that the drive information includes a drive current of the light emitting element or a drive temperature of the light emitting element.

The above arrangement enables the drive information analyzing section to appropriately estimate a characteristic of the light emitting element in accordance with a drive current or a drive temperature.

The information recording device in accordance with the present invention includes: a head section that includes a light emitting element for heating a magnetic recording medium capable of recording information, and a magnetic field generating element for recording information in the magnetic recording medium; a drive information obtaining section for obtaining, as a drive information of the light emitting element, a drive condition in which the light emitting element is operating; an abnormality detecting section for detecting an abnormality by comparing (i) a value which is indicated in the drive information obtained by the drive information obtaining section with (ii) a reference value predetermined in advance; and a head control section that controls an operation of the head section in accordance with a detection result detected by the abnormality detecting section.

In the above arrangement, the head control section controls the head section in accordance with a detection result obtained by the abnormality detecting section. The abnormality detecting section detects an abnormality in the light emitting element by comparing a value indicated in the drive information having been obtained by the drive information obtaining section with a reference value set in advance.

Therefore, in a case in which an unexpected abnormality occurs in the light emitting element, the above arrangement allows the abnormality detecting section to detect the abnormality. This makes it possible, for example, to limit or suspend an operation of a head section including the light emitting element in which the abnormality is detected.

Thus, according to the above arrangement, it is possible to realize an information recording device with high recording reliability.

The information recording device in accordance with the present invention is preferably such that when the abnormality detecting section detects the abnormality in the light emitting element, the head control section changes the operation of the head section including the light emitting element, from a normal operation to another operation.

The above arrangement makes it possible to limit an operation of a head section including the light emitting element in which the abnormality has been detected, make a backup of information, or the like.

Therefore, the above arrangement not only slows down the progress of deterioration in a light emitting element but also protects information stored in a magnetic storing section.

The information recording device in accordance with the present invention is preferably such that when the abnormality detecting section detects an abnormality in the light emitting element, the head control section stops the operation of the light emitting element in which the abnormality has been detected.

According to the above arrangement, it is possible to surely prevent further progress of deterioration in the light emitting element.

In addition, the information recording device in accordance with the present invention is preferably such that when an abnormality is detected in the light emitting element, the abnormality detecting section controls a warning information output section to outputs warning information informing a user that the abnormality has occurred in the light emitting element.

According to the above arrangement, when an abnormality is detected in a light emitting element, the abnormality detecting section can inform a user that the abnormality has occurred by, for example, causing the display section to display a warning screen.

The information recording device in accordance with the present invention is preferably such that the head control section prohibits the head section from recording new information to the magnetic recording medium and changes an operation of the head section so that the head only rewrites and reads information.

According to the above arrangement, it is possible to limit operation of the head section to the lowest possible. This slows down progress of deterioration in the light emitting element, progress of an abnormality in the light emitting element, or the like.

Note that Patent Literature 4 only discloses control of a light emitting element when the light emitting element reaches the end of its life. In addition, the above arrangement cannot be found even if, for example, a technique disclosed by Patent Literature 3 is applied to an information recording device in which a head includes not only a light emitting element but also a magnetic recording element and the like.

The information recording device in accordance with the present invention is preferably such that the head control section changes an operation of the head section so that the head stops recording information to the magnetic recording medium.

According to the above arrangement, it is possible to completely block progress of deterioration in the light emitting element, progress of an abnormality in the light emitting element, or the like.

A method of controlling the information recording device in accordance with the present invention includes the steps of: (a) recording information in a magnetic recording medium by using a head section that includes a light emitting element for heating a magnetic recording medium capable of recording information, and a magnetic field generating element for recording information in the magnetic recording medium; (b) obtaining, as a drive information of the light emitting element, a drive condition in which the light emitting element is operating in the step (a); and (c) controlling the head section for controlling an operation of the head section in accordance with the drive information thus obtained in the step (b) or/and a record of the drive information, the record in which the drive information thus obtained in the step (b) has been stored.

The above arrangement includes the step of controlling the head section for controlling an operation of the head section in accordance with drive information obtained in the step of obtaining drive information or/and a record of the drive information, the record in which the drive information obtained in the step of obtaining drive information has been stored.

Therefore, according to the above arrangement, it is possible to refer to past drive information of a light emitting element. This makes it possible to apply an application that uses (utilizes) a record of drive information so that a new function is added to the information recording device.

For example, it is possible to estimate a degree of load having been generated in a light emitting element in the past in accordance with a record of drive information, the drive information having been stored in the drive information storing section. This makes it possible to accurately estimate a remaining life of the light emitting element, a current degree of deterioration, and the like.

As described above, the above arrangement makes it possible to grasp a state of a light emitting element by using drive information. Accordingly, it is possible to control the head section in accordance with the state of the light emitting element so as to prevent wrong information from being recorded.

Thus, according to the above arrangement, it is possible to realize a method of controlling an information recording device with high recording reliability.

A computer in accordance with the present invention includes the above information recording device.

According to the above arrangement, it is possible to realize a computer such as a PC with high recording reliability.

An image recording device in accordance with the present invention includes the above information recording device.

According to the above arrangement, it is possible to realize an image recording device with high recording reliability.

[Supplement]

Note that it is also possible to express the present invention as follows. That is, the information recording device in accordance with the present invention including: a head that includes a light emitting element and a magnetic field generating element; a head control section that controls an operation of the head; and an information recording medium capable of recording information, the information recording device includes (i) light emitting element operating state detecting means for detecting an operating state of the light emitting element and (ii) record information recording means capable of recording the detected operating state of the light emitting element and storing the same as record information.

The information recording device in accordance with the present invention is also such that the head includes a reading element which can read information recorded in the information recording medium The information recording device in accordance with the present invention has a plurality of the heads, and the head control section controls the plurality of the heads separately.

The information recording device in accordance with the present invention estimates a characteristic of the light emitting element by using the operating state and stores the estimated characteristic as record information.

The information recording device in accordance with the present invention estimates a characteristic of the light emitting element by using the record information.

The information recording device in accordance with the present invention estimates a characteristic of the light emitting element by using both of the operating state and the record information.

The information recording device in accordance with the present invention is such that the operating state is a drive current and a drive temperature of the light emitting element.

The information recording device in accordance with the present invention is such that the characteristic of the light emitting element is a remaining life of the element.

The information recording device in accordance with the present invention is such that the characteristic of the light emitting element is whether or not there is a deterioration factor which causes deterioration in the light emitting element, the deterioration other than deterioration caused by drive under a normal usage condition.

The information recording device in accordance with the present invention is such that whether or not there is a deterioration factor which causes deterioration in the light emitting element, the deterioration other than deterioration caused by drive under a normal usage condition is estimated by comparing (a) a remaining life of the light emitting section which is estimated by using not less than 90% of the record information recorded till the present time with (b) a remaining life of the light emitting element which is obtained at a point when the estimation of whether or not there is the irreversible deterioration factor is carried out, the remaining life being estimated based on the first 10%, since the record started to be obtained, of the record information of the light emitting element.

The information recording device in accordance with the present invention, in a case where the estimated characteristic exceeds a reference value having been set in advance, informs a user that the estimated characteristic exceeds the reference value.

The information recording device in accordance with the present invention is such that, in a case where the estimated characteristic exceeds a reference value set in advance, the head control section causes the light emitting element having a head exceeding the reference values to operate differently from a normal operation.

The information recording device in accordance with the present invention is such that the head control section controls the plurality of recording heads in accordance with the record information so that the plurality of the recording heads operate differently.

The information recording device in accordance with the present invention including: a head that includes a light emitting element and a magnetic field generating element; a head control section that controls an operation of the head; an information recording medium capable of recording information; and light emitting element operating state detecting means for detecting an operating state of the light emitting element, the information recording device detects an abnormality by comparing the detected operating state of the light emitting element with a reference value set in advance in the information recording device.

The information recording device in accordance with the present invention is such that, in a case where the abnormality is detected, the head control section causes the light emitting element to operate differently from the normal operation.

The information recording device in accordance with the present invention is such that, in a case where the abnormality is detected, the head control section causes the light emitting element to stop operating.

The information recording device in accordance with the present invention, in a case where the abnormality is detected, informs a user of the abnormality.

The information recording device in accordance with the present invention is such that the operation different from the normal operation is to stop the head from recording new information and to allows the head to only rewrite and read information.

The information recording device in accordance with the present invention is such that the operation different from the normal operation is to stops the head from recording information.

A method of controlling the information recording device in accordance with the present invention includes the steps of: detecting an operating state of a light emitting element having been detected by the light emitting element operation detecting means; detecting record information of the operating state of the light emitting element; detecting an abnormality regarding an estimation of a problem by comparing the operating state or the record information with a reference value set in advance; and, in a case where an abnormality is detected, outputting information of the abnormality.

A computer in accordance with the present invention includes the information recording device or carries out the method of controlling the information recording device.

An image recording device in accordance with the present invention includes the information recording device or carries out the method of controlling the information recording device.

INDUSTRIAL APPLICABILITY

The present invention is applicable to various devices that include a magnetic recording medium such as a hard disk.

REFERENCE SIGNS LIST

1 Information recording device
1a Information recording device
2 Magnetic head (Head section)
2a Magnetic head (Head section)
2b Magnetic head (Head section)
2c Magnetic head (Head section)
2d Magnetic head (Head section)
3 Magnetic head control section (Head control section)
4 Drive information obtaining section
5 Drive information storing section
6 Abnormality detecting section
7 Warning information output section
8 Drive information analyzing section
10 Disk medium (Magnetic recording medium)
21 Recording section
22 Reading section
23 Temperature sensor
24 Magnetic field generating section (Magnetic field generating element)
25 Semiconductor laser (Light emitting element)
26 Light receiving element
26a Spectral element
27 Near-field light emitting section
28 Reading element
29 Slider
30 Suspension
60 Reference value storing section
80 Registered value storing section
100 Computer
101 Computer control section
102 Central arithmetic section
103 Main storing section
104 Display section
105 Input interface
106 Sound output section
110 Image recording device
111 Television tuner

The invention claimed is:

1. An information recording device comprising:
a head section that includes a light emitting element for heating a magnetic recording medium capable of recording information, and a magnetic field generating element for recording information in the magnetic recording medium;
a drive information obtaining section for obtaining, as a drive information of the light emitting element, a drive condition in which the light emitting element is operating;
a drive information storing section that is capable of storing therein the drive information thus obtained by the drive information obtaining section; and
a head control section that controls an operation of the head section,
the head control section, being configured to, based on the drive condition, prohibit the head section from recording new information to the magnetic recording medium and changes an operation of the head section so that the head only rewrites information partially and reads the information.

2. The information recording device according to claim 1, wherein the head section further includes a reading element for reading information recorded in the magnetic recording medium.

3. The information recording device according to claim 1 comprising a plurality of the head sections, wherein the head control section controls the head sections separately.

4. The information recording device according to claim 3, wherein the head control section controls the head sections in accordance with the drive information so that each of the head sections operates differently.

5. The information recording device according to claim 1 further comprising a drive information analyzing section for analyzing the drive information and estimating a characteristic regarding a functional impairment of the light emitting element,
the drive information analyzing section being configured to output the characteristic thus estimated to the head control section, and
the head control section being configured to control an operation of the head section in accordance with the characteristic thus outputted from the drive information analyzing section.

6. The information recording device according to claim 5, wherein the drive information analyzing section estimates the characteristic in accordance with the drive information outputted from the drive information obtaining section.

7. The information recording device according to claim 5, wherein the drive information analyzing section estimates the characteristic in accordance with the drive information stored in the drive information storing section.

8. The information recording device according to claim 5, wherein the drive information analyzing section estimates the characteristics in accordance with the drive information outputted from the drive information obtaining section and the drive information stored in the drive information storing section.

9. The information recording device according to claim 5, wherein the characteristic is a remaining life of the light emitting element.

10. The information recording device according to claim 5 wherein the characteristics is whether or not there is deterioration in the light emitting element, the deterioration having been caused by an unexpected deterioration factor.

11. The information recording device according to claim 10, wherein the estimation of whether or not there is deterioration in the light emitting element, the deterioration having been caused by the unexpected deterioration factor is carried out by comparing (a) a remaining life of the light emitting element, the remaining life being estimated from a first group of drive information stored in the drive information storing section, the first group being stored in the drive information storing section in a period from 90% of a recording period to a point when the estimation is carried out with (b) a remaining life of the light emitting element, the remaining life being estimated in accordance with a second group of the drive information stored in the drive information storing section, the second group being stored in the drive information storing section in a period from a point when storing was started to less than 10% of the storing period, where the storing period is a period from the point when storing was started to the point when the estimation is carried out.

12. The information recording device according to claim 6, wherein when a value indicating the characteristic exceeds a designated threshold, the drive information analyzing section controls a warning information output section to outputs warning information informing a user that the value indicating the characteristic has exceeded the designated threshold.

13. The information recording device according to claim 6, wherein when a value indicating the characteristic of the light emitting element exceeds a designated threshold, the head control section changes the operation of the head section including the light emitting element, from a normal operation to another operation.

14. The information recording device according to claim 1 wherein the drive information includes a drive current of the light emitting element or a drive temperature of the light emitting element.

15. The information recording device according to claim 13, wherein the head control section changes an operation of the head section so that the head stops recording information to the magnetic recording medium.

16. A computer comprising an information recording device recited in claim 1.

17. An image recording device comprising an information recording device recited in claim 1.

18. An information recording device comprising:
  a head section that includes a light emitting element for heating a magnetic recording medium capable of recording information, and a magnetic field generating element for recording information in the magnetic recording medium;
  a drive information obtaining section for obtaining, as a drive information of the light emitting element, a drive condition in which the light emitting element is operating;
  an abnormality detecting section for detecting an abnormality by comparing (i) a value which is indicated in the drive information obtained by the drive information obtaining section with (ii) a reference value predetermined in advance; and
  a head control section that controls an operation of the head section in accordance with a detection result detected by the abnormality detecting section,
  the head control section, being configured to, based on the drive condition, prohibit the head section from recording new information to the magnetic recording medium and changes an operation of the head section so that the head only rewrites information partially and reads the information.

19. The information recording device according to claim 18, wherein when the abnormality detecting section detects the abnormality in the light emitting element, the head control section changes the operation of the head section including the light emitting element, from a normal operation to another operation.

20. The information recording device according to claim 18, wherein when the abnormality detecting section detects an abnormality in the light emitting element, the head control section stops the operation of the light emitting element in which the abnormality has been detected.

21. The information recording device according to claim 18, wherein when an abnormality is detected in the light emitting element, the abnormality detecting section controls a warning information output section to outputs warning information informing a user that the abnormality has occurred in the light emitting element.

22. A method of controlling an information recording device comprising the steps of:
  (a) recording information in a magnetic recording medium by using a head section that includes a light emitting element for heating a magnetic recording medium capable of recording information, and a magnetic field generating element for recording information in the magnetic recording medium;
  (b) obtaining, as a drive information of the light emitting element, a drive condition in which the light emitting element is operating in the step (a);
  (c) controlling the head section for controlling an operation of the head section in accordance with the drive information thus obtained in the step (b) or/and a record of the drive information, the record in which the drive information thus obtained in the step (b) has been stored;
  (d) prohibiting, by the head control section, based on the drive condition, the head section from recording new information to the magnetic recording medium; and
  (e) changing an operation of the head section so that the head only rewrites information partially and reads the information.

\* \* \* \* \*